US012684985B2

(12) United States Patent
Song et al.

(10) Patent No.:     US 12,684,985 B2
(45) Date of Patent:         Jul. 14, 2026

(54) DISPLAY APPARATUS INCLUDING PLURALITY OF ORGANIC LIGHT EMITTING MATERIAL LAYER AND ELECTRONIC APPARATUS

(71) Applicant: Samsung Electronics Co., Ltd., Suwon-si (KR)

(72) Inventors: Sunjin Song, Seoul (KR); Hyun Koo, Seongnam-si (KR); Wonjae Joo, Seongnam-si (KR); Juncheol Bae, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 557 days.

(21) Appl. No.: 17/888,878

(22) Filed: Aug. 16, 2022

(65) Prior Publication Data

US 2023/0240112 A1     Jul. 27, 2023

(30) Foreign Application Priority Data

Jan. 25, 2022     (KR) ........................ 10-2022-0011047

(51) Int. Cl.
H01L 27/32          (2006.01)
H01L 51/50          (2006.01)
          (Continued)

(52) U.S. Cl.
CPC .......... H10K 59/38 (2023.02); H10K 50/125 (2023.02); H10K 50/852 (2023.02); H10K 50/856 (2023.02)

(58) Field of Classification Search
CPC ...... H10K 59/38; H10K 59/35; H10K 59/123; H10K 59/1275; H10K 50/818;
          (Continued)

(56) References Cited

U.S. PATENT DOCUMENTS 8,614,698 B2    12/2013    Desieres et al.
9,425,245 B2     8/2016    Song et al.
          (Continued)

FOREIGN PATENT DOCUMENTS

EP          3876284 A1    9/2021
KR    1020180096826 A    8/2018
          (Continued)

OTHER PUBLICATIONS

Extended European Search Report dated Jun. 26, 2023, issued in corresponding EP Patent Application No. 22191472.4.
          (Continued)

*Primary Examiner* — Steven B Gauthier
*Assistant Examiner* — Rhys Poniente Sheker
(74) *Attorney, Agent, or Firm* — CANTOR COLBURN LLP

(57)          ABSTRACT

A display apparatus includes first to third pixels, and the first pixel includes a reflective layer; a first electrode; a light emitting layer; a second electrode; and a first color filter to transmit light of the first wavelength band. The reflective layer and the second electrode define a micro-cavity in which the light of the first wavelength band resonates. The light emitting layer includes a first organic light emitting material layer which emits the light of the first wavelength band, a second organic light emitting material layer which emits the light of the second wavelength band, and a third organic light emitting material layer which emits the light of the third wavelength band.

30 Claims, 28 Drawing Sheets

(51) Int. Cl.

| | |
|---|---|
| *H01L 51/52* | (2006.01) |
| *H10K 50/125* | (2023.01) |
| *H10K 50/852* | (2023.01) |
| *H10K 50/856* | (2023.01) |
| *H10K 59/38* | (2023.01) |

(58) Field of Classification Search

CPC .. H10K 50/816; H10K 50/852; H10K 50/125; H10K 50/856; H10K 50/12; H10K 50/00–88; H10K 71/00–861; C09K 11/06

See application file for complete search history.

(56) References Cited

U.S. PATENT DOCUMENTS

| | | | | |
|---|---|---|---|---|
| 9,478,768 | B2 | 10/2016 | Lee et al. | |
| 10,079,358 | B2 | 9/2018 | Song et al. | |
| 10,944,077 | B2 | 3/2021 | Mollard et al. | |
| 2006/0244370 | A1* | 11/2006 | Tyan | H10K 50/19 |
| | | | | 313/506 |
| 2012/0025185 | A1 | 2/2012 | Kasamatsu | |
| 2014/0353635 | A1* | 12/2014 | Chou | H10K 59/876 |
| | | | | 257/40 |
| 2018/0333402 | A1 | 11/2018 | De Vasconcelos et al. | |
| 2019/0013364 | A1 | 1/2019 | Yokota | |
| 2019/0198816 | A1 | 6/2019 | Park et al. | |
| 2019/0198817 | A1* | 6/2019 | Joo | H10K 50/16 |
| 2019/0393439 | A1 | 12/2019 | Jankus et al. | |
| 2020/0044177 | A1 | 2/2020 | Kim et al. | |
| 2020/0052209 | A1 | 2/2020 | Heggemann et al. | |
| 2020/0058905 | A1 | 2/2020 | Kyoung et al. | |
| 2020/0144549 | A1* | 5/2020 | Zhou | H10K 85/6574 |
| 2020/0227685 | A1* | 7/2020 | Kyoung | H10K 50/125 |
| 2020/0243800 | A1* | 7/2020 | Joo | H10K 59/35 |
| 2020/0251040 | A1 | 8/2020 | Lee et al. | |
| 2020/0292741 | A1* | 9/2020 | Rhee | G02B 5/0294 |
| 2020/0403037 | A1* | 12/2020 | Joo | H10K 59/876 |
| 2021/0199972 | A1 | 7/2021 | Joung et al. | |
| 2021/0280832 | A1 | 9/2021 | Koo et al. | |
| 2021/0288290 | A1 | 9/2021 | Lee et al. | |
| 2021/0296616 | A1 | 9/2021 | Song et al. | |
| 2021/0313545 | A1 | 10/2021 | Thompson et al. | |
| 2022/0020828 | A1 | 1/2022 | Lee et al. | |
| 2022/0020949 | A1 | 1/2022 | Bae et al. | |
| 2022/0020963 | A1 | 1/2022 | Lee et al. | |
| 2022/0037613 | A1 | 2/2022 | Song et al. | |
| 2022/0158123 | A1 | 5/2022 | Koo et al. | |
| 2022/0246707 | A1 | 8/2022 | Choi et al. | |
| 2022/0271259 | A1 | 8/2022 | Song et al. | |
| 2023/0082071 | A1 | 3/2023 | Song et al. | |

FOREIGN PATENT DOCUMENTS

| | | | |
|---|---|---|---|
| KR | 1020190000759 | A | 1/2019 |
| KR | 102013316 | B1 | 8/2019 |
| KR | 1020200089143 | A | 7/2020 |
| KR | 1020210084047 | A | 7/2021 |
| KR | 1020210086336 | A | 7/2021 |
| KR | 1020220068545 | A | 5/2022 |
| WO | 2020232225 | A1 | 11/2020 |

OTHER PUBLICATIONS

Korean Office Action mailed Jul. 10, 2025 in KR Application No. 10-2022-0011047, 32 pages, (w/ English translation).

* cited by examiner

DISPLAY APPARATUS INCLUDING PLURALITY OF ORGANIC LIGHT EMITTING MATERIAL LAYER AND ELECTRONIC APPARATUS

CROSS-REFERENCE TO RELATED APPLICATION

This application claims priority to Korean Patent Application No. 10-2022-0011047, filed on Jan. 25, 2022, and all the benefits accruing therefrom under 35 U.S.C. § 119, the content of which in its entirety is herein incorporated by reference.

BACKGROUND

1. Field

Embodiments of the invention relate to a display apparatus and an electronic apparatus including the display apparatus, and more particularly, to a display apparatus having improved luminous efficiency and color purity by including a plurality of organic light emitting material layers, and an electronic apparatus including the display apparatus.

2. Description of the Related Art

An organic light emitting display OLED device is a display device in which an image is displayed by combining holes supplied from an anode and electrons supplied from a cathode in the organic light emitting layer to emit light. Such an organic light emitting display device may exhibit high display characteristics such as a wide viewing angle, fast response speed, thin thickness, low manufacturing cost, and high contrast.

In addition, it is possible to emit a desired color by selecting an appropriate material as the material of the organic light emitting layer in the organic light emitting display device. Accordingly, a color display apparatus may be effectively implemented using an organic light emitting display device.

SUMMARY

Embodiments of the invention provide a display apparatus with improved luminous efficiency and color purity, and an electronic apparatus including the display apparatus.

According to an embodiment of the invention, a display apparatus includes: a first pixel which emits light of a first wavelength band; a second pixel which emits light of a second wavelength band different from the first wavelength band; and a third pixel which emits light of a third wavelength band different from the first wavelength band and the second wavelength band, where the first pixel includes: a reflective layer; a first electrode disposed on the reflective layer of the first pixel; a light emitting layer disposed on the first electrode of the first pixel; a second electrode disposed on the light emitting layer of the first pixel; and a first color filter disposed on the second electrode of the first pixel to transmit the light of the first wavelength band, where the reflective layer and the second electrode define a first micro-cavity in which the light of the first wavelength band resonates, where the light emitting layer of the first pixel includes a first organic light emitting material layer which emits the light of the first wavelength band, a second organic light emitting material layer which emits the light of the second wavelength band, and a third organic light emitting material layer which emits the light of the third wavelength band.

In an embodiment, the first organic light emitting material layer of the first pixel may be disposed on an antinode of the first wavelength band resonating within the first micro-cavity.

In an embodiment, the first micro-cavity may be defined to generate a third or higher order resonance with respect to the first wavelength band.

In an embodiment, the reflective layer may have a flat reflective surface.

In an embodiment, the first organic light emitting material layer of the first pixel may include a first light emitting dopant, the second organic light emitting material layer of the first pixel includes a second light emitting dopant, and the third organic light emitting material layer of the first pixel includes a third light emitting dopant, where the second organic light emitting material layer of the first pixel and the third organic light emitting material layer of the first pixel may be disposed adjacent to or mixed with each other to enable energy transfer from the second light emitting dopant to the third light emitting dopant.

In an embodiment, the second organic light emitting material layer may be spaced apart from the first organic light emitting material layer and disposed in direct contact with the third organic light emitting material layer.

In an embodiment, each of the second light emitting dopant and the third light emitting dopant may include a phosphorescent dopant material, and the first light emitting dopant may include a fluorescent dopant material.

In an embodiment, the light emitting layer of the first pixel may further include a mixture layer of the second organic light emitting material layer of the first pixel and the third organic light emitting material layer of the first pixel, and the mixture layer of the first pixel may be disposed between the second organic light emitting material layer of the first pixel and the third organic light emitting material layer of the first pixel.

In an embodiment, a concentration of a second light emitting dopant in the second organic light emitting material layer of the first pixel may be higher than a concentration of a third light emitting dopant in the third organic light emitting material layer of the first pixel.

In an embodiment, the first organic light emitting material layer of the first pixel may include a first light emitting dopant, the second organic light emitting material layer of the first pixel may include a second light emitting dopant, and the third organic light emitting material layer of the first pixel includes a third light emitting dopant, where the first organic light emitting material layer of the first pixel and the third organic light emitting material layer of the first pixel may be disposed adjacent to or mixed with each other to enable energy transfer from the first light emitting dopant to the third light emitting dopant.

In an embodiment, the first organic light emitting material layer of the first pixel may be spaced apart from the second organic light emitting material layer of the first pixel and disposed in direct contact with the third organic light emitting material layer of the first pixel.

In an embodiment, each of the first light emitting dopant and the third light emitting dopant may include a phosphorescent dopant material, and the second light emitting dopant may include a fluorescent dopant material.

In an embodiment, the light emitting layer of the first pixel may further include a mixture layer of the first organic light emitting material layer of the first pixel and the third organic light emitting material layer of the first pixel, and the mixture layer of the first pixel may be disposed between the first organic light emitting material layer of the first pixel and the third organic light emitting material layer of the first pixel.

In an embodiment, a concentration of a first light emitting dopant in the first organic light emitting material layer of the first pixel may be higher than a concentration of a third light emitting dopant in the third organic light emitting material layer of the first pixel.

In an embodiment, the second pixel may include: a reflective layer; a first electrode disposed on the reflective layer of the second pixel; a light emitting layer disposed on the first electrode of the second pixel; and a second electrode disposed on the light emitting layer of the second pixel, where the reflective layer of the second pixel and the second electrode of the second pixel may define a second micro-cavity in which light of a second wavelength band resonates, where the light emitting layer of the second pixel may include a first organic light emitting material layer which emits light of the first wavelength band, a second organic light emitting material layer which emits light of the second wavelength band, and a third organic light emitting material layer which emits light of the third wavelength band.

In an embodiment, the second organic light emitting material layer of the second pixel may be disposed on an antinode of the second wavelength band resonating within the second micro-cavity.

In an embodiment, the micro-cavity of the second pixel may be defined to generate a third or higher order resonance with respect to the second wavelength band.

In an embodiment, the reflective layer of the second pixel may include a plurality of nanostructures periodically arranged therein.

In an embodiment, an arrangement period of the plurality of nanostructures may be in a range of about 50 nanometers (nm) to about 400 nm.

In an embodiment, each of the plurality of nanostructures may be defined by a pillar or hole having a circular or polygonal shape and in 4-fold symmetry.

In an embodiment, each of the plurality of nanostructures may have a plurality of sides, and an interior angle between two adjacent sides among plurality of sides is greater than about 180 degrees.

In an embodiment, a height or depth of each of the plurality of nanostructures may be in a range of about 0 nm to about 150 nm.

In an embodiment, the second pixel may further include a second color filter disposed on the second electrode of the second pixel to transmit the light of the second wavelength band.

In an embodiment, the reflective layer of the second pixel may have a flat reflective surface, where the reflective layer of the first pixel and the reflective layer of the second pixel may have different thicknesses from each other.

In an embodiment, the third pixel may include: a reflective layer; a first electrode disposed on the reflective layer of the third pixel; a light emitting layer disposed on the first electrode of the third pixel; a second electrode disposed on the light emitting layer of the third pixel; and a third color filter disposed on the second electrode of the third pixel to transmit the light of the third wavelength band, where the reflective layer of the third pixel and the second electrode of the third pixel may define a third micro-cavity in which light of a third wavelength band resonates, where the light emitting layer of the third pixel may include a first organic light emitting material layer which emits light of the first wavelength band, a second organic light emitting material layer which emits light of the second wavelength band, and a third organic light emitting material layer which emits light of the third wavelength band.

In an embodiment, the third organic light emitting material layer of the third pixel may be disposed on an antinode of the third wavelength band resonating within the third micro-cavity.

In an embodiment, the light emitting layer of the first pixel, the light emitting layer of the second pixel, and the light emitting layer of the third pixel may have the same structure.

In an embodiment, the reflective layer of the third pixel may include a plurality of nanostructures periodically arranged therein.

In an embodiment, the reflective layer of the third pixel may have a flat reflective surface.

According to an embodiment of the invention, an electronic apparatus includes a processor, a memory, an input device, a sound output device, and a display apparatus, where the display apparatus includes: a first pixel which emits light of a first wavelength band; a second pixel which emits light of a second wavelength band different from the first wavelength band; and a third pixel which emits light of a third wavelength band different from the first wavelength band and the second wavelength band, where the first pixel includes: a reflective layer; a first electrode disposed on the reflective layer; a light emitting layer disposed over the first electrode; a second electrode disposed on the light emitting layer; and a first color filter disposed on the second electrode to transmit the light of the first wavelength band, where the reflective layer and the second electrode defined a micro-cavity in which the light of the first wavelength band resonates, where the light emitting layer includes a first organic light emitting material layer which emits the light of the first wavelength band, a second organic light emitting material layer which emits the light of the second wavelength band, and a third organic light emitting material layer which emits the light of the third wavelength band.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
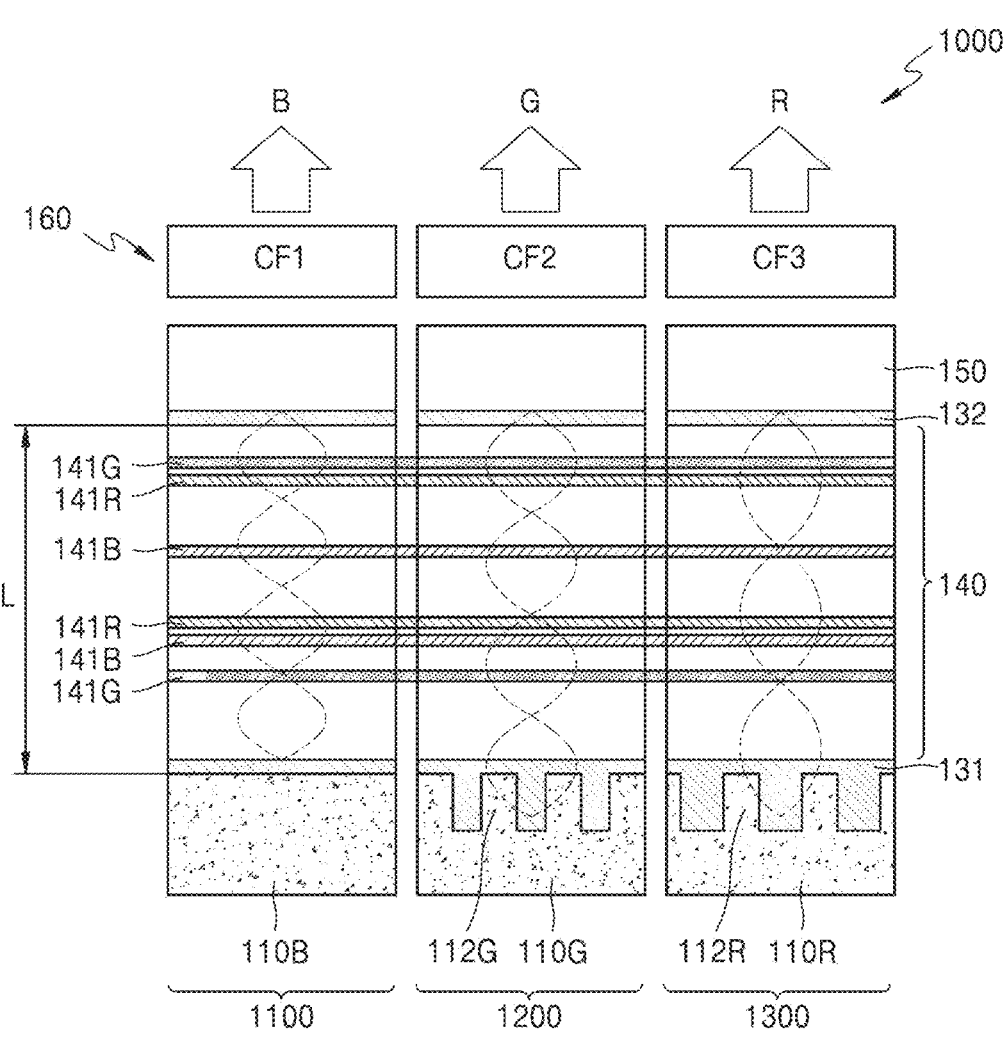
FIG. 1 is a cross-sectional view schematically showing a structure of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In addition, terms such as "unit" and "module" described in the specification mean a unit that processes at least one function or operation, and this may be implemented as hardware or software, or may be implemented as a combination of hardware and software.

The connection or connection members of lines between the components shown in the drawings are illustrative of functional connections and/or physical or circuit connections, and may be represented as a variety of functional connections, physical connections, or circuit connections that are replaceable or additional in an actual device.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a display apparatus including a plurality of organic light emitting material layers will be described in detail with reference to the accompanying drawings. In the following drawings, the same reference numerals refer to the same components, and the size of each component in the drawings may be exaggerated for clarity and convenience of description. Further, the embodiments described below are merely exemplary, and various modifications are possible from these embodiments.

FIG. 1 is a cross-sectional view schematically illustrating a structure of a display apparatus according to an example embodiment. Referring to FIG. 1, an embodiment of a display apparatus 1000 may include a plurality of pixels that emit light of different colors from each other. The plurality of pixels may include a first pixel 1100, a second pixel 1200, and a third pixel 1300 disposed adjacent to each other on a same plane (or a same surface) of a substrate (not shown). In an embodiment, for example, the first pixel 1100 may be a blue pixel that emits light of a blue wavelength band (i.e., the first wavelength band), the second pixel 1200 may be a green pixel that emits light of a green wavelength band (i.e., a second wavelength band), and the third pixel 1300 may be a red pixel that emits light of a red wavelength band (i.e., the third wavelength band). Although only one pixel unit including the first pixel 1100, the second pixel 1200, and the third pixel 1300 is illustrated in FIG. 1 for convenience of illustration, in an embodiment, a very large number of the first pixels 1100, the second pixels 1200, and the third pixels 1300 may be repeatedly arranged. Also, although not shown, a pixel separation film may be further disposed between the first pixel 1100, the second pixel 1200, and the third pixel 1300.

The first pixel 1100 may include a first reflective layer 1108, a first electrode 131 disposed on the first reflective layer 1108, a light emitting layer 140 disposed on the first electrode 131, and a second electrode 132 disposed on the light emitting layer 140. The first pixel 1100 may further include a transparent protective layer 150 disposed on the second electrode 132 and a first color filter CF1 disposed on the transparent protective layer 150. The first color filter CF1 may be configured to transmit light of the first wavelength band and absorb light of other wavelength bands.

The second pixel 1200 may include a second reflective layer 110G, a first electrode 131 disposed on the second reflective layer 110G, a light emitting layer 140 disposed on the first electrode 131, and a second electrode 132 disposed on the light emitting layer 140. The second pixel 1200 may further include a transparent protective layer 150 disposed on the second electrode 132 and a second color filter CF2 disposed on the transparent protective layer 150. The second color filter CF2 may be configured to transmit light of the second wavelength band and absorb light of other wavelength bands.

The third pixel 1300 may include a third reflective layer 110R, a first electrode 131 disposed on the third reflective layer 110R, a light emitting layer 140 disposed on the first electrode 131, and a second electrode 132 disposed on the light emitting layer 140. The third pixel 1300 may further include a transparent protective layer 150 disposed on the second electrode 132 and a third color filter CF3 disposed on the transparent protective layer 150. The third color filter CF3 may be configured to transmit light of the third wavelength band and absorb light of other wavelength bands.

The first electrode 131 disposed on the lower surface of the light emitting layer 140 may serve as an anode providing holes. The second electrode 132 disposed on the upper surface of the light emitting layer 140 may serve as a cathode for providing electrons. In such an embodiment, the first electrode 131 may include or be made of a material having a relatively high work function, and the second electrode 132 may include or be made of a material having a relatively low work function.

In an embodiment, the first electrode 131 may be a transparent electrode having a property of transmitting light (e.g., visible light). In an embodiment, for example, the first electrode 131 may include a transparent conductive oxide such as indium tin oxide (ITO), indium zinc oxide (IZO), or aluminum zinc oxide (AZO).

The second electrode 132 may be a transflective electrode that reflects a portion of light and transmits a portion of the light. In such an embodiment, the second electrode 132 may include a very thin reflective metal. In an embodiment, for example, the second electrode 132 includes or is made of silver (Ag), aluminum (Al), gold (Au), nickel (Ni), or an alloy thereof, or may have a multi-layer structure of silver (Ag) and magnesium (Mg) or a multi-layer structure of aluminum (Al) and lithium (Li). The total thickness of the second electrode 132 may be in a range of about 10 nanometers (nm) to about 50 nm. Since the thickness of the second electrode 132 is very thin, a portion of light may pass through the reflective metal.

In an embodiment, the display apparatus 1000 may be an organic light emitting diode (OLED) display apparatus. In such an embodiment, the light emitting layer 140 may include an organic light emitting material. In an embodiment, for example, the light emitting layer 140 may include at least one first organic light emitting material layer 141B for generating light of the first wavelength band, at least one second organic light emitting material layer 141G for generating light of the second wavelength, and at least one third organic light emitting material layer 141R for generating light of the third wavelength band. In an embodiment, for example, the first organic light emitting material layer 141B may generate blue light, the second organic light emitting material layer 141G may generate green light, and the third organic light emitting material layer 141R may emit red light. In such an embodiment, the first organic light emitting material layer 141B may be doped with a first light emitting dopant for emitting blue light, the second organic light emitting material layer 141G may be doped with a second light emitting dopant for emitting green light, and the third organic light emitting material layer 141R may be doped with a third light emitting dopant for emitting red light. As a result, the light emitting layer 140 may generate white light including blue light, green light, and red light. Although it is illustrated in FIG. 1 that the light emitting layer 140 includes two first to third organic light emitting material layers 141B, 141G, and 141R, respectively, this is merely exemplary and is not necessarily limited thereto.

In an embodiment of the display apparatus 1000, the first electrode 131, the light emitting layer 140, the second electrode 132, and the protective layer 150 may have a configuration common to all pixels. In such an embodiment, the first to third pixels 1100, 1200, and 1300 may include a first electrode 131, a light emitting layer 140, a second electrode 132, and a protective layer 150 having a same structure as each other. Accordingly, the first to third pixels 1100, 1200, and 1300 may have a same physical thickness, and this is because it is not necessary to differently form the first electrode 131, the light emitting layer 140, the second electrode 132, and the protective layer 150 for each pixel, such that the display apparatus 1000 may be manufactured relatively easily by simplifying the manufacturing process of the display apparatus 1000. In particular, the display apparatus 1000 having a large sized screen may be easily manufactured.

The first to third reflective layers 110B, 110G, and 110R may be configured to reflect light generated from the light emitting layer 140 and transmitted through the first electrode 131. In addition, the first to third reflective layers 1108, 110G, and 110R may include or be formed of a conductive material. In an embodiment, for example, the first to third reflective layers 1108, 110G, and 110R may include or be formed of silver (Ag), gold (Au), aluminum (Al), nickel (Ni), or an alloy thereof. However, the invention is not necessarily limited thereto, and the first to third reflective layers 1108, 110G, and 110R may include other reflective materials as long as the first to third reflective layers have high reflectance and conductivity.

In an embodiment of the display apparatus 1000, the spectrum of light emitted from the first to third pixels 1100, 1200, and 1300 may be determined by the structure of the first to third reflective layers 1108, 110G, and 110R. In such an embodiment, the first reflective layer 1108 may form or define a first micro-cavity (or a first micro-cavity structure) that resonates light of a first wavelength band together with the second electrode 132, the second reflective layer 110G may form or define a second micro-cavity that resonates light of a second wavelength band together with the second electrode 132, and the third reflective layer 110R may form or define a third micro-cavity that resonates light of a third wavelength band together with the second electrode 132.

The resonance wavelength of the first micro-cavity formed between the first reflective layer 1108 and the second electrode 132 may be determined by an optical length L of the first micro-cavity, a phase delay by the second electrode 132, and a phase shift (e.g., phase delay) by the first reflective layer 1108. The optical length L of the first micro-cavity may be determined by an optical thickness of the layers disposed between the first reflective layer 1108 and the second electrode 132. The optical thickness of the layers disposed between the first reflective layer 1108 and the second electrode 132 is not a simple physical thickness but is a thickness in consideration of the refractive index of the materials of the layers disposed between the first reflective layer 1108 and the second electrode 132. In an embodiment, for example, the optical thickness of the layers disposed between the first reflective layer 1108 and the second electrode 132 may be the sum of the optical thickness of the first electrode 131 and the optical thickness of the light emitting layer 140.

In such an embodiment, the resonance wavelength of the second micro-cavity formed between the second reflective layer 110G and the second electrode 132 may be determined by the optical length of the second micro-cavity, the phase delay by the second electrode 132, and the phase shift (e.g., phase delay) by the second reflective layer 110G, and the resonance wavelength of the third micro-cavity formed between the third reflective layer 110R and the second electrode 132 may be determined by the optical length of the third micro-cavity, the phase delay by the second electrode 132, and a phase shift (e.g., phase delay) by the third reflective layer 110R. According to an embodiment, the optical thickness of the first electrode 131, the optical thickness of the light emitting layer 140, and the phase delay by the second electrode 132 are the same as each other in the first to third pixels 1100, 1200, and 1300, and only the phase shift by the first to third reflective layers 1108, 110G, and 110R may be different from each other.

The upper surface of the first reflective layer 1108 may include a flat reflective surface. In an embodiment, the distance between the upper surface of the first reflective layer 1108 and the lower surface of the second electrode 132 may be determined such that light of the first wavelength band among the light generated by the light emitting layer 140 resonates within the first micro-cavity. In such an embodiment, the light of the first wavelength band corresponding to the resonance wavelength of the first micro-cavity among the light generated by the light emitting layer 140 may be emitted from the first pixel 1100 through the second electrode 132 to the outside after resonating between the first reflective layer 1108 and the second electrode 132. In an embodiment, a distance between the upper surface of the first reflective layer 1108 and the lower surface of the second electrode 132 may be determined to generate a third or higher-order resonance with respect to the light of the first wavelength band within the first micro-cavity. In such an embodiment, since the emission spectrum of the light emitted through the first pixel 1100 has a relatively narrow full width at half maximum, color purity may be improved. In an embodiment, as shown in FIG. 1, the fourth-order resonance may occur with respect to the light of the first wavelength band within the first micro-cavity, but the embodiment is not necessarily limited thereto, and the optical length of the first micro-cavity may be selected such that a third-order resonance or a fifth-order or higher resonance occurs.

The distance between the upper surface of the second reflective layer 110G and the lower surface of the second electrode 132 may be equal to the distance between the upper surface of the first reflective layer 1108 and the lower surface of the second electrode 132. A phase modulation surface may be defined or formed on the upper surface of the second reflective layer 110G in contact with the first electrode 131 so that the second reflective layer 110G has a phase shift different from that of the first reflective layer 1108. The phase modulation surface may include very small patterns on the nanoscale. In an embodiment, for example, the phase modulation surface of the second reflective layer 110G may have a meta structure in which nanostructures 112G or 112R having a size smaller than a wavelength of visible light are periodically disposed. The resonance wavelength of the second micro-cavity formed between the second reflective layer 110G and the second electrode 132 may be determined by the shape of the meta structure. The meta structure formed on the upper surface of the second reflective layer 110G may be designed in a way such that light of the second wavelength band among the light emitted from the light emitting layer 140 resonates in the second micro-cavity. A structure of a meta structure may be variously changed.

FIGS. 2 to 5 are perspective views schematically showing various exemplary structures of the meta structure of the second reflective layer 110B shown in FIG. 1.

Figure 2:
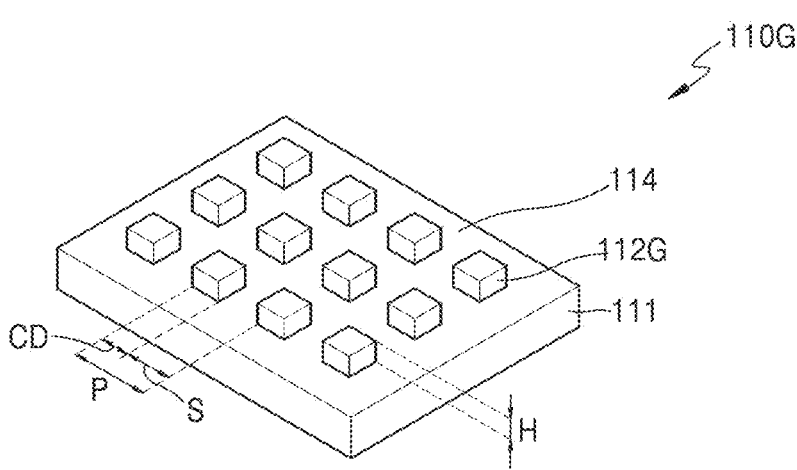
FIGS. 2 to 5 are perspective views schematically illustrating various exemplary structures of the meta structure of the second reflective layer shown in FIG. 1.

Referring to FIG. 2, in an embodiment, the second reflective layer 110G may include a base 111 and a phase modulation surface formed or defined on the upper surface 114 of the base 111. The phase modulation surface of the second reflective layer 110G may include a plurality of nanostructures 112G periodically arranged on the upper surface 114 of the base 111. The plurality of nanostructures 112G may have a pillar shape protruding from the upper surface 114 of the base 111 toward the first electrode 131. In an embodiment, for example, the plurality of nanostructures 112G may have a shape of a square post. The plurality of nanostructures 112G may be integrally formed with the base 111 as a single unitary and indivisible part. The second reflective layer 110G may be disposed under the first electrode 131 in a way such that upper surfaces of the plurality of nanostructures 112G contact the first electrode 131.

The optical properties of the phase modulation surface (e.g., phase delay of reflected light) may be determined by a critical dimension CD of each nanostructure 112G, a height H of each nanostructure 112G, and a pitch or period P of the plurality of nanostructures 112G. In an embodiment, for example, where each nanostructure 112G is a square pillar, e.g., cube or cuboid, the critical dimension CD of the nanostructure 112G may be the length of one side of each nanostructure 112G. The pitch or period P of the plurality of nanostructures 112G may be the sum of the critical dimension CD of each nanostructure 112G and the spacing S between two adjacent nanostructures 112G.

The critical dimension CD, height H, and period P of the plurality of nanostructures 112G over the entire area of the phase modulation surface may be constant. In such an embodiment, the plurality of nanostructures 112G may be uniformly distributed on the base. In an embodiment, for example, the critical dimension CD of the nanostructure 112G may be in a range of about 20 nm to about 250 nm, the height H of the nanostructure 112G may be in a range of about 0 nm to about 150 nm, the period P of the plurality of nanostructures 112G may be in a range of about 50 nm to about 400 nm, and the spacing S between the plurality of nanostructures 112G may be in a range of about 30 nm to about 250 nm. A critical dimension CD of each nanostructure 112G, a height H of each nanostructure 112G, a pitch or period P of the plurality of nanostructures 112G, and a spacing S between the plurality of nanostructures 112G may be less than a wavelength of visible light.

If the size of each nanostructure 112G of the phase modulation surface is less than the resonance wavelength, as incident light resonates in the periphery of the plurality of nanostructures 112G, a plurality of nano light resonance structures is formed by the plurality of nanostructures 112G. In particular, the electric field component among the incident light does not penetrate into the space between the plurality of nanostructures 112G, and only the magnetic field component resonates in the periphery of the plurality of nanostructures 112G. Accordingly, the plurality of nano light resonance structures formed in the space between the plurality of nanostructures 112G are cylinder-type magnetic resonators in which the magnetic field component of the incident light resonates at the periphery of the plurality of nanostructures 112G. As a result, a phase shift greater than a simple phase shift due to an effective optical distance (H×n) determined by the product of the height H of the plurality of nanostructures 112G and the refractive index n of the plurality of nanostructures 112G may occur in the phase modulation surface of the second reflective layer 110G.

Therefore, in such an embodiment, the resonance wavelength of the second micro-cavity may be determined by the critical dimension CD of each nanostructure 112G of the phase modulation surface, the height H of each nanostructure 112G, and the period P of the plurality of nanostructures 112G. In an embodiment, for example, a critical dimension CD of each nanostructure 112G of the phase modulation surface, a height H of each nanostructure 112G, and a period P of the plurality of nanostructures 112G may be selected or determined in a way such that the sum of the phase modulation by the optical length of the second micro-cavity for the second wavelength and the phase modulation on the phase modulation surface is equal to $2(m+1)\pi$. Here, m is an integer.

Accordingly, the light of the second wavelength band corresponding to the resonance wavelength of the second micro-cavity among the light generated by the light emitting layer 140 may be emitted from the second pixel 1200 through the second electrode 132 to the outside after resonating between the second reflective layer 110G and the second electrode 132. In an embodiment, a critical dimension CD of each nanostructure 112G, a height H of each nanostructure 112G, and a period P of the plurality of nanostructures 112G may be selected or determined in a way such that a higher-order resonance of the third or higher order occurs with respect to the light of the second wavelength band in the second micro-cavity. Accordingly, since the emission spectrum of the light emitted through the second pixel 1200 has a relatively narrow full width at half maximum, color purity may be improved. In an embodiment, as shown in FIG. 1, the fourth-order resonance occurs with respect to the light of the second wavelength band within the second micro-cavity, but the embodiment is not necessarily limited thereto, and the optical length of the second micro-cavity may be selected or determined in a way such that a resonance higher than the third-order resonance occurs.

In an embodiment, the plurality of nanostructures 112G may be regularly and periodically arranged to have 4-fold symmetry to prevent the second micro-cavity from having polarization dependence. If the second micro-cavity has polarization dependence, only light of a particular polarization component resonates, so that the luminous efficiency of the second pixel 1200 may be reduced. Although an embodiment where each nanostructure 112G has a square pillar shape is illustrated in FIG. 2, but the nanostructure 112G may have various shapes other than the square pillar to have 4-fold symmetry.

Figure 3:
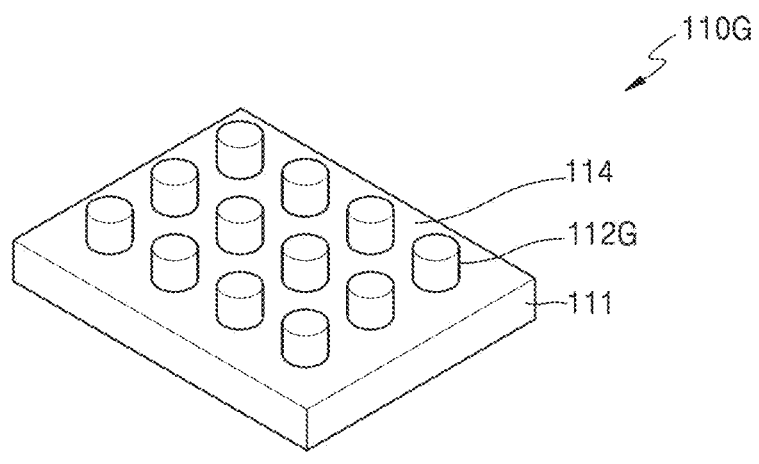

In an alternative embodiment, for example, referring to FIG. 3, the nanostructure 112G may have a cylindrical shape protruding from the upper surface 114 of the base 111 toward the first electrode 131. In such an embodiment where the nanostructure 112G has a cylindrical shape, the critical dimension of the nanostructure 112G may be the diameter of the cylinder. In FIGS. 2 and 3, each nanostructure 112G are shown to have cylindrical and square pillar shapes, respectively, but the shape of each nanostructure 112G is not necessarily limited thereto. In another alternative embodiment, for example, each nanostructure 112G may have a pentagonal or more regular polygonal pillar shape. In an embodiment, as shown in FIGS. 2 and 3, the plurality of nanostructures 112G are arranged in a regular two-dimensional array pattern. In such an embodiment, spacing between two adjacent nanostructures 112G in the entire area of the phase modulation surface may be constant. However, in an embodiment where the plurality of nanostructures 112G have 4-fold symmetry, the plurality of nanostructures 112G may be arranged in any other type of array.

Figure 4:
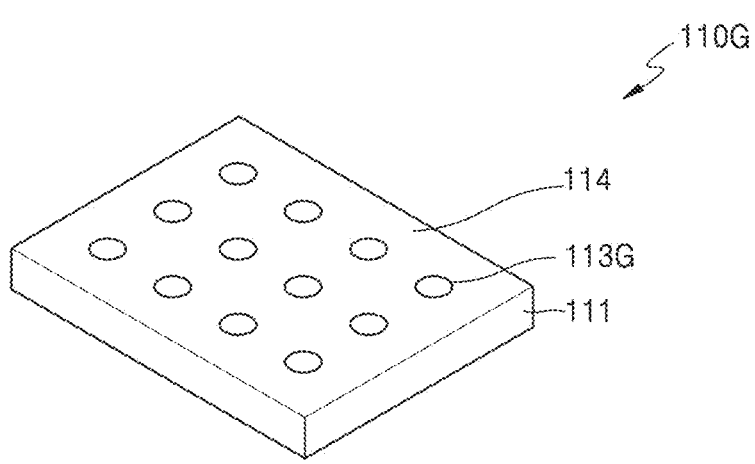

In another alternative embodiment, referring to FIG. 4, the second reflective layer 110G may have a concave hole-shaped nanostructure 113G instead of a pillar-shaped nanostructure 112G. FIG. 4 illustrates an embodiment where each nanostructure 113G is a circular hole in, but not being limited thereto. Alternatively, each nanostructure 113G may be a regular polygonal hole. The depth of the hole-shaped nanostructure 113G may be in a range of about 0 nm to about 150 nm, which is the same as the height H of the pillar-shaped nanostructure 112G.

Figure 5:
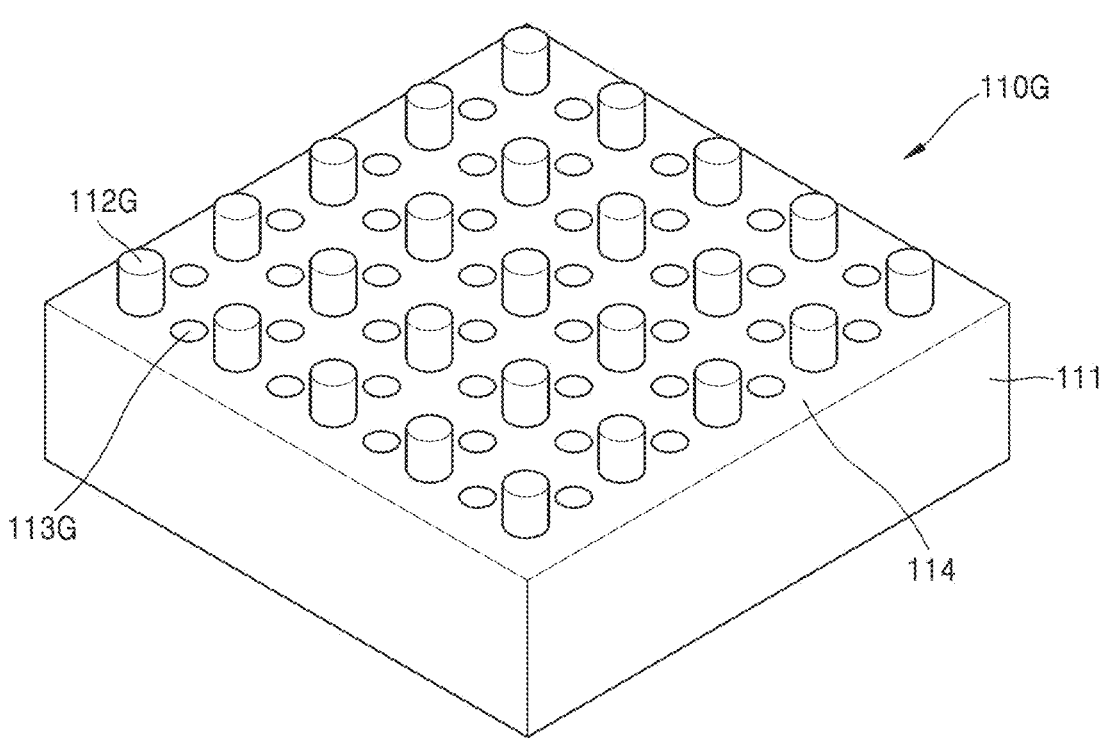

In another alternative embodiment, referring to FIG. 5, the second reflective layer 110G may include a pillar-shaped nanostructure 112G and a hole-shaped nanostructure 113G together. In such an embodiment, a hole-shaped nanostructure 113G may be disposed between two adjacent pillar-shaped nanostructures 112G. In such an embodiment, the pillar-shaped nanostructures 112G and the hole-shaped nanostructures 113G may be alternately arranged with each other.

The third reflective layer 110R may also have a meta structure similar to that of the second reflective layer 110G. The distance between the upper surface of the third reflective layer 110R and the lower surface of the second electrode 132 may be equal to the distance between the upper surface of the first reflective layer 110B and the lower surface of the second electrode 132. A phase modulation surface may be defined or formed on the upper surface of the third reflective layer 110R in contact with the first electrode 131 such that the third reflective layer 110R has a phase shift different from that of the first reflective layer 110B and the second reflective layer 110G. The phase modulation surface of the third reflective layer 110R may have a structure similar to that of the phase modulation surface of the second reflective layer 110G described above with reference to FIGS. 2 to 5. In an embodiment, for example, the phase modulation surface of the third reflective layer 110R may include a plurality of periodically arranged nanostructures 112R.

The resonance wavelength of the third micro-cavity may be determined by a critical dimension of each nanostructure 112R, a height of each nanostructure 112R, and a period of the plurality of nanostructures 112R. In an embodiment, for example, a critical dimension of each nanostructure 112R of the phase modulation surface, a height of each nanostructure 112R, and a period of the plurality of nanostructures 112R may be selected or determined in a way such that the sum of the phase modulation by the optical length of the third micro-cavity for the third wavelength and the phase modulation on the phase modulation surface is equal to $2(m+1)\pi$.

Accordingly, the light of the third wavelength band corresponding to the resonance wavelength of the third micro-cavity among the light generated by the light emitting layer 140 may be emitted from the third pixel 1300 to the outside through the second electrode 132 after resonating between the third reflective layer 110R and the second electrode 132. In such an embodiment, a critical dimension of each nanostructure 112R, a height of each nanostructure 112R, and a period of the plurality of nanostructures 112R may be selected or determined in a way such that a second or higher order resonance occurs with respect to the light of the third wavelength band within the third micro-cavity. In FIG. 1, it is illustrated that the third-order resonance occurs with respect to the light of the third wavelength band within the third micro-cavity, but the embodiment is not necessarily limited thereto, and the optical length of the third micro-cavity may be selected or determined such that a resonance higher than the second-order resonance occurs.

In such an embodiment, the radioactive decay rate of the light source in the micro-cavity changes under the influence of the Q-factor and mode volume of the micro-cavity in the micro-cavity structure, and this phenomenon is called the Purcell effect. in an embodiment, the radioactive decay rate of the light source may be increased by enhancing the Purcell effect and the spontaneous emission rate may be improved. In an embodiment, the high Q-factor, the highly oriented dopant material within the organic light emitting material layer, and the optimization of the position of the organic light emitting material layer may be adjusted to strengthen the Purcell effect based on Fermi's golden rule. In an embodiment, the organic light emitting material layers may be located at a position where the electric field intensity of the resonant wavelength resonant within the micro-cavity is maximized, that is, at the antinode of a standing wave of the resonant wavelength resonant within the micro-cavity, to optimize the position of the organic light emitting material layer.

In an embodiment, for example, a first organic light emitting material layer 141B may be positioned on an antinode of a first wavelength standing wave resonating within the first micro-cavity, a second organic light emitting material layer 141G may be positioned on the antinode of the second wavelength standing wave resonating within the second micro-cavity, and a third organic light emitting material layer 141R may be positioned on the antinode of the third wavelength standing wave resonating within the third micro-cavity. Here, the first to third organic light emitting material layers 141B, 141G, and 141R do not have to be perfectly precisely positioned on the antinode of each corresponding wavelength standing wave. In an embodiment, for example, when the antinodes of the first to third wavelength standing waves are located very closely or overlap each other, the first through third organic light emitting material layers 141B, 141G, and 141R may be disposed at a location where the amplitude of each corresponding wavelength standing wave is greater than or equal to about 70% of the maximum amplitude of each corresponding wavelength standing wave. Herein, the position of the antinode may mean a position where the amplitude of the standing wave is about 70% or more of the maximum amplitude of the standing wave.

Figure 6:
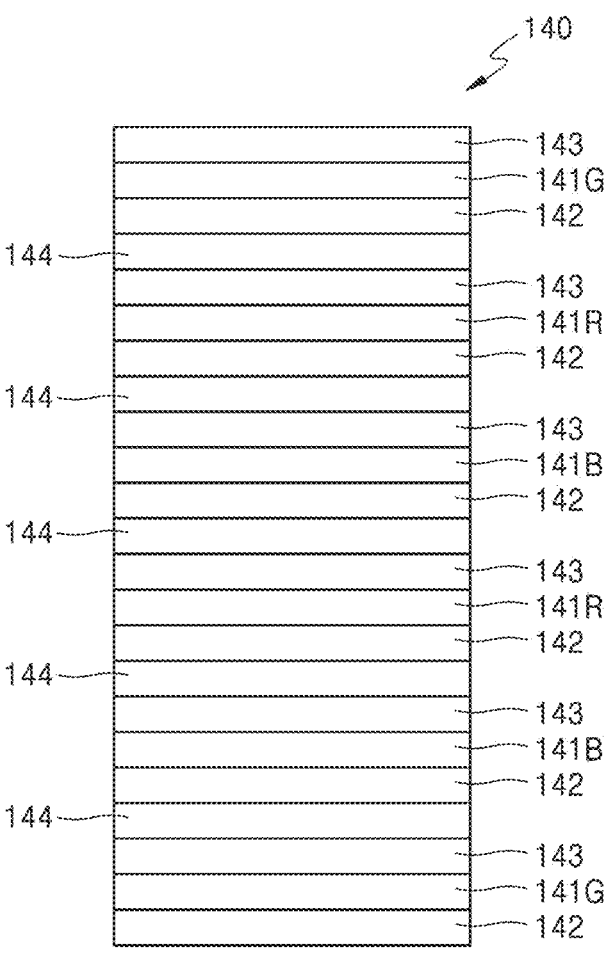
FIG. 6 is a cross-sectional view schematically illustrating an exemplary structure of the light emitting layer shown in FIG. 1.

In FIG. 1, for convenience of illustration, only the first to third organic light emitting material layers 141B, 141G, and 141R included in the light emitting layer 140 are shown, but the light emitting layer 140 may further include other various layers as desired. FIG. 6 is a cross-sectional view schematically illustrating an exemplary structure of the light emitting layer 140 shown in FIG. 1. Referring to FIG. 6, an embodiment of the light emitting layer 140 may further include an electron injection layer 143 disposed on an upper surface of each of the first to third organic light emitting material layers 141B, 141G, and 141R, a hole injection layer 142 disposed on a lower surface of each of the first to third organic light emitting material layers 141B, 141G, and 141R, and a charge generation layer 144 disposed between the adjacent hole injection layer 142 and the electron injection layer 143. In such an embodiment, a hole transport layer may be further disposed between the hole injection layer 142 and each of the first to third organic light emitting material layers 141B, 141G, and 141R, and an electron transfer layer may be further disposed between the electron injection layer 143 and each of the first to third organic light emitting material layers 141B, 141G, and 141R. In such an embodiment, an electron block layer may be further disposed between the hole transfer layer and each of the first to third organic light emitting material layers 141B, 141G, and 141R, and a hole block layer may be further disposed between the electron transfer layer and each of the first to third organic light emitting material layers 141B, 141G, and 141R.

In FIG. 6, all layers are shown to have a substantially same thickness as each other for convenience of illustration, but the layers shown in FIG. 6 may have different thicknesses from each other as desired. The charge generation layer 144 may also serve as a spacer layer for adjusting the position of the first organic light emitting material layer 141B, the position of the second organic light emitting material layer 141G, and the position of the third organic light emitting material layer 141R together with the role of enhancing charge transfer. In such an embodiment, by differently adjusting the thicknesses of the plurality of charge generation layers 146, the first organic light emitting material layer 141B may be disposed on the antinode of the first wavelength standing wave, the second organic light emitting material layer 141G may be disposed on the antinode of the second wavelength standing wave, and the third organic light emitting material layer 141R may be disposed on the antinode of the third wavelength standing wave.

Figure 7:
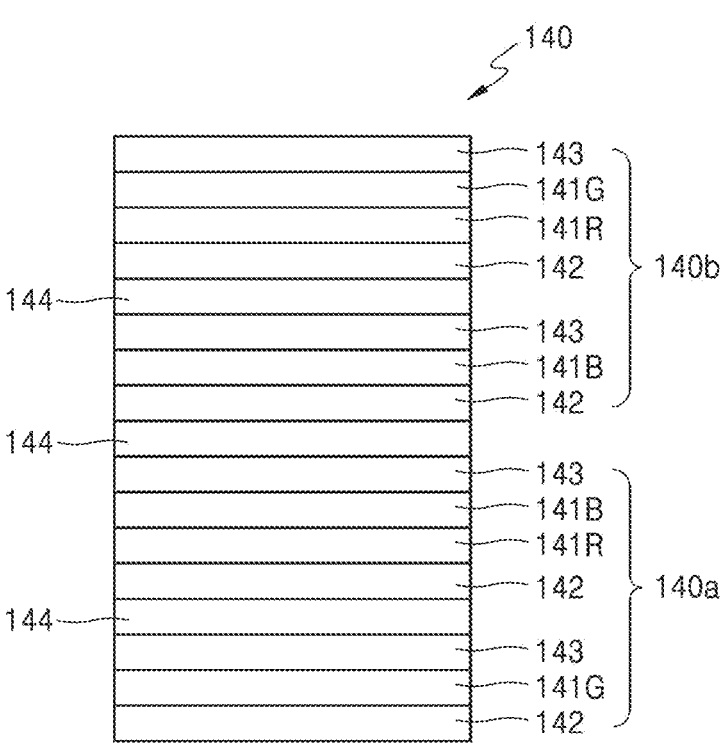
FIG. 7 is a cross-sectional view schematically showing another exemplary structure of the light emitting layer shown in FIG. 1.

FIG. 7 is a cross-sectional view schematically showing another exemplary structure of the light emitting layer 140 shown in FIG. 1. Referring to FIG. 7, an embodiment of the light emitting layer 140 may include a first portion 140a and a second portion 140b. In the first portion 140a, the first organic light emitting material layer 141B may be spaced apart from the second organic light emitting material layer 141G and may be disposed in direct contact with the third organic light emitting material layer 141R. In such an embodiment, the first organic light emitting material layer 141B and the third organic light emitting material layer 141R contacting each other may be disposed together between one electron injection layer 143 and one hole injection layer 142. In such an embodiment, in the second portion 140b, the second organic light emitting material layer 141G may be spaced apart from the first organic light emitting material layer 141B and may be disposed in direct contact with the third organic light emitting material layer 141R. In such an embodiment, the second organic light emitting material layer 141G and the third organic light emitting material layer 141R contacting each other may be disposed together between one electron injection layer 143 and one hole injection layer 142.

Figure 8:
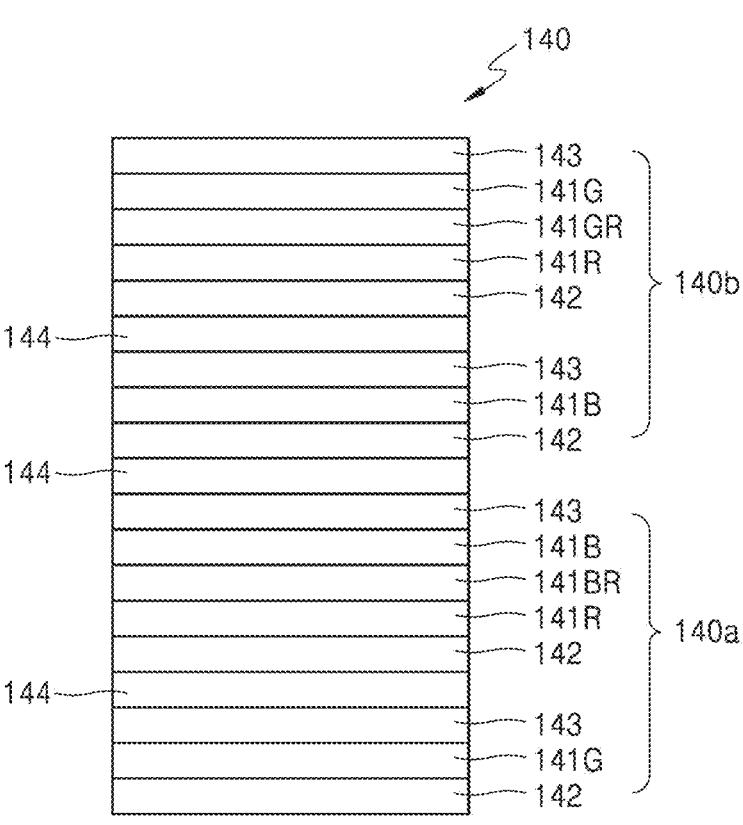
FIG. 8 is a cross-sectional view schematically showing another exemplary structure of the light emitting layer shown in FIG. 1.

FIG. 8 is a cross-sectional view schematically showing another exemplary structure of the light emitting layer 140 shown in FIG. 1. Referring to FIG. 8, in an embodiment, in the first portion 140a of the light emitting layer 140, the first organic light emitting material layer 141B may be disposed to partially overlap the third organic light emitting material layer 141R. As a result, a mixture layer 141BR of the first organic light emitting material layer 141B and the third organic light emitting material layer 141R may be further disposed between the first organic light emitting material layer 141B and the third organic light emitting material layer 141R. In such an embodiment, in the second portion 140b of the light emitting layer 140, the second organic light emitting material layer 141G may be disposed to partially overlap the third organic light emitting material layer 141R. As a result, the mixture layer 141GR of the second organic light emitting material layer 141G and the third organic light emitting material layer 141R may be further disposed between the second organic light emitting material layer 141G and the third organic light emitting material layer 141R.

As shown in FIGS. 7 and 8, in an embodiment where the first organic light emitting material layer 141B and the third organic light emitting material layer 141R are disposed adjacent to each other or mixed, energy transfer may be possible from the first light emitting dopant in the first organic light emitting material layer 141B to the third light emitting dopant in the third organic light emitting material layer 141R. In such an embodiment, when the second organic light emitting material layer 141G and the third organic light emitting material layer 141R are disposed adjacent to or mixed with each other, energy transfer may be possible from the second light emitting dopant in the second organic light emitting material layer 141G to the third light emitting dopant in the third organic light emitting material layer 141R.

In an embodiment, in the first portion 140a of the light emitting layer 140, for energy transfer between the first organic light emitting material layer 141B and the third organic light emitting material layer 141R, the first light emitting dopant in the first organic light emitting material layer 141B and the third light emitting dopant in the third organic light emitting material layer 141R may be a phosphorescent dopant material. In such an embodiment, in the first portion 140a of the light emitting layer 140, the second light emitting dopant in the second organic light emitting material layer 141R may be a fluorescent dopant material. In such an embodiment, in the second portion 140b of the light emitting layer 140, for energy transfer between the second organic light emitting material layer 141G and the third organic light emitting material layer 141R, the second light emitting dopant in the second organic light emitting material layer 141G and the third light emitting dopant in the third organic light emitting material layer 141R may be a phosphorescent dopant material. In such an embodiment, in the second portion 140b of the light emitting layer 140, the first light emitting dopant in the first organic light emitting material layer 141B may be a fluorescent dopant material. In the mixture layer 141BR of the first organic light emitting material layer 141B and the third organic light emitting material layer 141R shown in FIG. 8, the first light emitting dopant and the third light emitting dopant including or made of the phosphorescent dopant material are distributed together. In the mixture layer 141GR of the second organic light emitting material layer 141G and the third organic light emitting material layer 141R, the second light emitting dopant and the third light emitting dopant including or made of the phosphorescent dopant material may be distributed together.

Figure 9A:
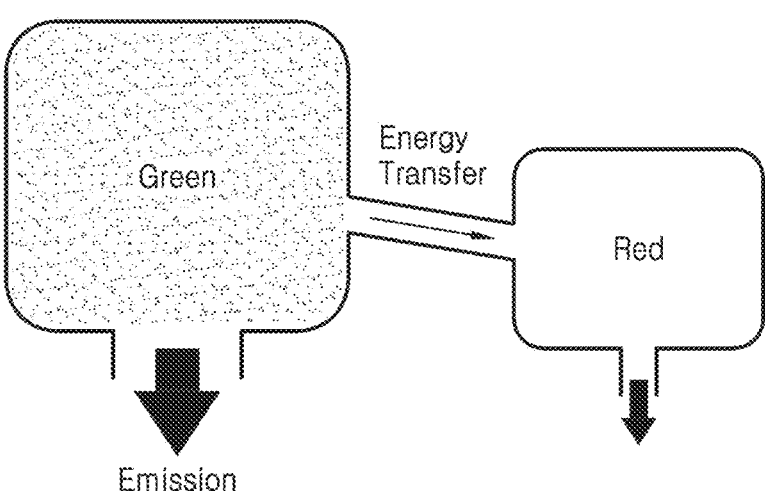
FIGS. 9A and 9B are conceptual diagrams illustrating energy transfer between heterogeneous light emitting dopants.
Figure 9B:
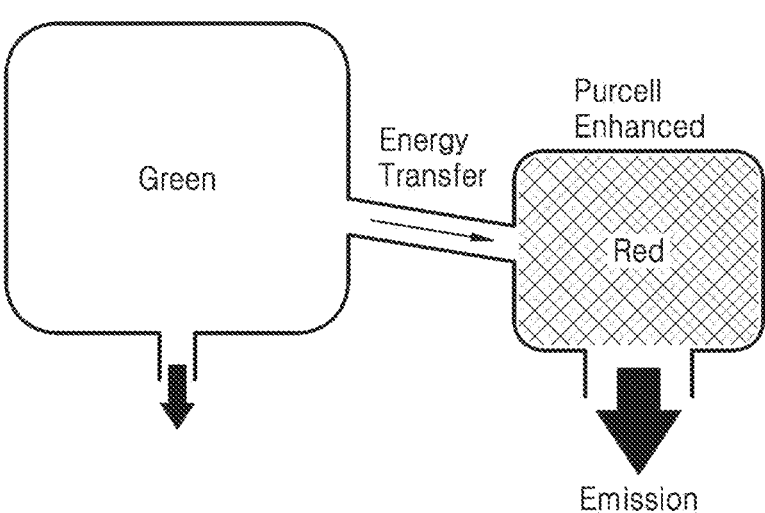

FIGS. 9A and 9B are conceptual diagrams illustrating energy transfer between heterogeneous light emitting dopants. In general, as the emission wavelength of the phosphorescent dopant material is longer, the radioactive decay rate is faster. In other words, the phosphorescent dopant material rapidly absorbs energy and emits light as the emission wavelength is longer. Accordingly, the phosphorescent dopant material that emits green light absorbs energy more slowly than the phosphorescent dopant material that emits red light. When the second organic light emitting material layer 141G for emitting green light and the third organic light emitting material layer 141R for emitting red light are disposed adjacent to or mixed with each other such that energy transfer is enabled between the phosphorescent dopant material in the second organic light emitting material layer 141G and the phosphorescent dopant material in the third organic light emitting material layer 141R, while the second organic light emitting material layer 141G absorbs energy and emits green light (FIG. 9A), the energy remaining unabsorbed in the second organic light emitting material layer 141G is not wasted and transferred to the third organic light emitting material layer 141R, so that the third organic light emitting material layer 141R emits red light (FIG. 9B). The same principle may be applied when the first organic light emitting material layer 141B for emitting blue light and the third organic light emitting material layer 141R for emitting red light are disposed adjacent to or mixed with each other. Accordingly, luminous efficiency may be further increased by reducing overall energy loss.

The luminous efficiency of the second organic light emitting material layer 141G may be slightly lowered by this energy transfer from the second organic light emitting material layer 141G to the third organic light emitting material layer 141R. Accordingly, among the second organic light emitting material layer 141G and the third organic light emitting material layer 141R adjacent to each other, a concentration of the second light emitting dopant in the second organic light emitting material layer 141G may be higher than a concentration of the third light emitting dopant in the third organic light emitting material layer 141R. Also, in the mixture layer 141GR of the second organic light emitting material layer 141G and the third organic light emitting material layer 141R, the concentration of the second light emitting dopant may be higher than the concentration of the third light emitting dopant. In an embodiment, for example, the concentration of the second light emitting dopant may be in a range of about 5% to about 10%, and the concentration of the third light emitting dopant may be in a range of about 2% to about 3%. Likewise, the concentration of the first light emitting dopant in the first organic light emitting material layer 141B may be higher than the concentration of the third light emitting dopant in the third organic light emitting material layer 141R in the first organic light emitting material layer 141B and the third organic light emitting material layer 141R adjacent to each other, and the concentration of the first light emitting dopant may be higher than the concentration of the third light emitting dopant in the mixture layer 141BR of the first organic light emitting material layer 141B and the third organic light emitting material layer 141R. In an embodiment, for example, the concentration of the first light emitting dopant may be in a range of about 5% to about 10%.

in a case where a higher-order resonance occurs within the first to third micro-cavities, although the emission spectrum of light emitted through the first to third pixels 1100, 1200, and 1300 has a relatively narrow full width at half maximum, the light of the unwanted wavelength band is likely to be emitted while the light of the other wavelength band is resonated together. In an embodiment, for example, as the fourth-order resonance occurs for the light of the first wavelength band in the first micro-cavity and the third-order resonance for the light of the third wavelength band occurs at the same time in the first micro-cavity, the light of the first wavelength band and the light of the third wavelength band may be emitted together through the first pixel 1100. In addition, as the fourth-order resonance occurs for the light of the second wavelength band in the second micro-cavity and the third-order resonance occurs at the same time for the light of the third wavelength band in the second micro-cavity, the light of the first wavelength band and the light of the third wavelength band may be emitted together through the second pixel 1200. In addition, as the third-order resonance occurs for the light of the third wavelength band in the third micro-cavity and the fourth-order resonance occurs for the light of the first wavelength band or the light of the second wavelength band in the third micro-cavity, the light of the first wavelength band or the light of the second wavelength band may be emitted together with the light of the third wavelength band through the third pixel 1300.

Referring back to FIG. 1, the first to third color filters CF1, CF2, and CF3 suppress or reduce color mixing due to high-order resonance, such that color purity of light emitted through the first to third pixels 1100, 1200, and 1300 may be further improved. Since the wavelength selection has already occurred to a significant extent through the first to third micro-cavities, brightness or luminous efficiency may not be significantly reduced due to the first to third color filters CF1, CF2, and CF3. In an embodiment, as shown in FIG. 1, the color filter layer 160 including the first to third color filters CF1, CF2, and CF3 may be disposed on the protective layer 150, but the position of the color filter layer 160 is not limited thereto. In an alternative embodiment, for example, the color filter layer 160 may be disposed between the protective layer 150 and the second electrode 132.

Figure 10:
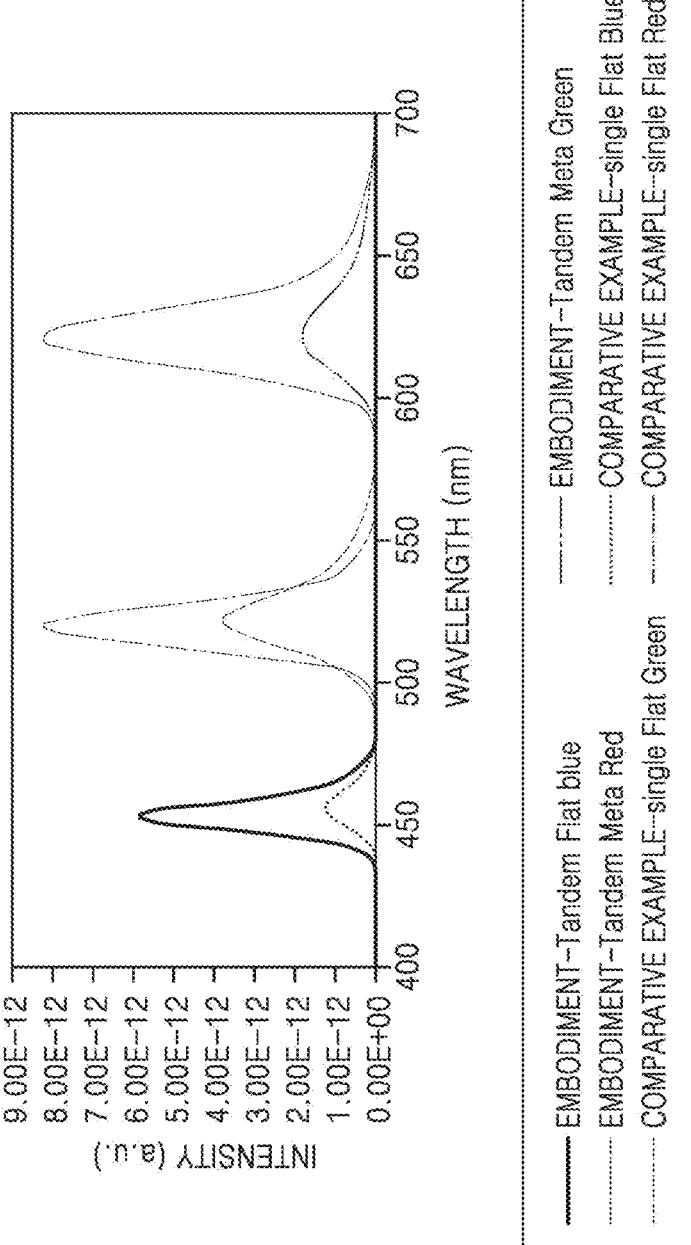
FIG. 10 is a graph exemplarily showing the luminous efficiency of the display apparatus according to an embodiment and the luminous efficiency of the display apparatus according to a comparative example.

FIG. 10 is a graph exemplarily showing the luminous efficiency of the display apparatus 1000 according to an embodiment of the invention and the luminous efficiency of the display apparatus according to a comparative example. The display apparatus according to the comparative example includes a first pixel having a single first organic light emitting material layer, a second pixel having a single second organic light emitting material layer, and a third pixel having a single third organic light emitting material layer. In addition, in the display apparatus according to the comparative example, the first to third micro-cavities were respectively formed in the first to third pixels by designing the thickness of the first pixel, the thickness of the second pixel, and the thickness of the third pixel to be different from each other. In the embodiment, the light emitting layer 140 of the structure shown in FIG. 7 was used. In the embodiment, the second reflective layer 110G includes a cylindrical nanostructure 112G having a diameter of about 50 nm and a height of about 50 nm, and a spacing between two adjacent nanostructures 112G is about 30 nm. The third reflective layer 110R includes a cylindrical nanostructure 112R having a diameter of about 50 nm and a height of about 50 nm, and a spacing between two adjacent nanostructures 112G is about 50 nm.

Referring to FIG. 10, in blue light, the luminous efficiency of the embodiment was increased by about 362% compared to the comparative example, and in green light, the luminous efficiency of the embodiment was increased by about 163% compared to the comparative example, and in red light, the luminous efficiency of the embodiment was increased by about 355% compared to the comparative example. In addition, as shown in FIG. 10, the full width at half maximum of the emission spectrum in the embodiment may be less than that of the emission spectrum in the comparative example.

Figure 11:
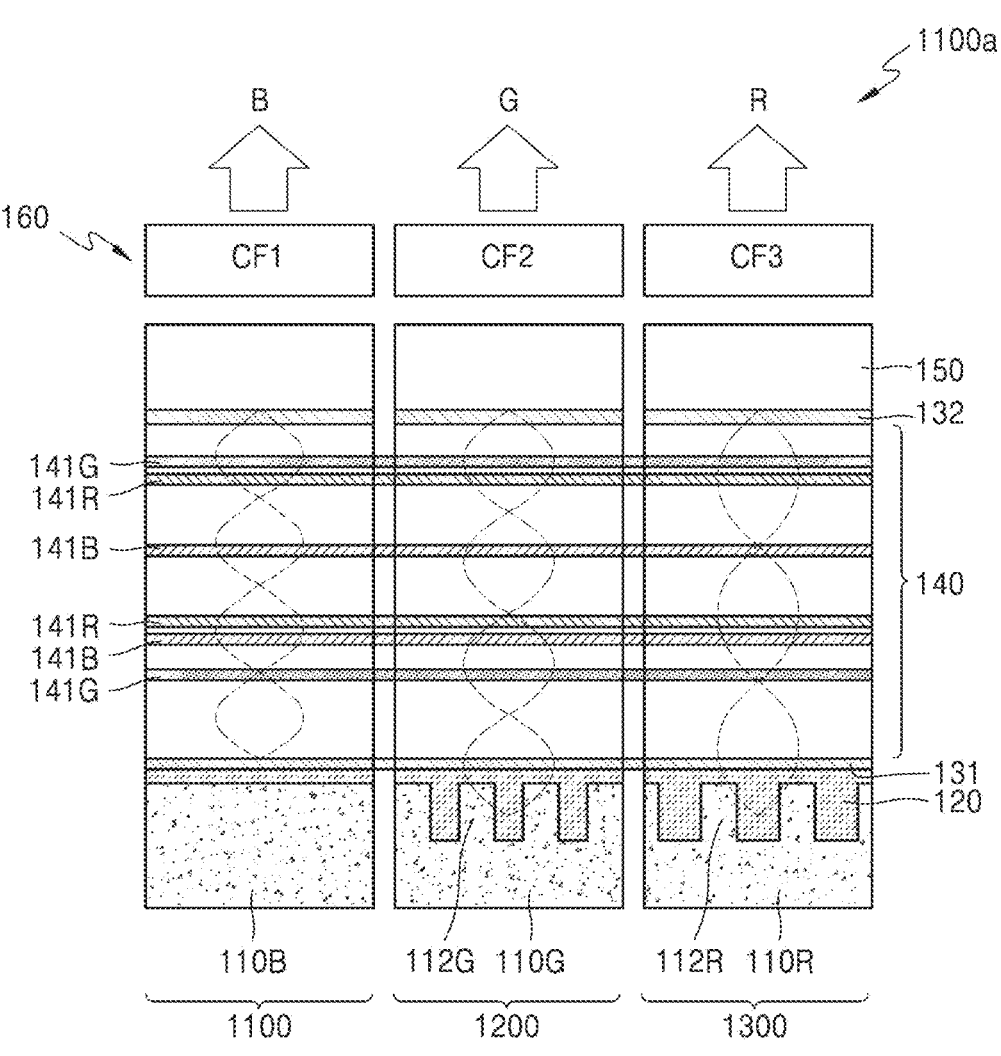
FIG. 11 is a cross-sectional view schematically illustrating a structure of a display apparatus according to an alternative embodiment.

FIG. 11 is a cross-sectional view schematically illustrating a structure of a display apparatus according to an alternative embodiment. Referring to FIG. 11, the display apparatus 1000a may further include a planarization layer 120 disposed under the first electrode 131. In an embodiment, for example, the planarization layer 120 may be respectively disposed between the first reflective layer 1106 and the first electrode 131, between the second reflective layer 110G and the first electrode 131, and between the third reflective layer 110R and the first electrode 131. Other configurations of the display apparatus 1000a illustrated in FIG. 11 are the same as those of the display apparatus 1000 illustrated in FIG. 1, and thus any repetitive detailed description thereof will be omitted.

In the embodiment of the display apparatus 1000 shown in FIG. 1, since the first electrode 131 is disposed directly on the second reflective layer 110G or the third reflective layer 110R in the second and third pixels 1200 and 1300, the lower surface of the first electrode 131 may have a shape complementary to the phase modulation surface of the second reflective layer 110G or the third reflective layer 110R. As a result, a current may be applied non-uniformly to the light emitting layer 140. In the embodiment of the display apparatus 1000a shown in FIG. 11, since the planarization layer 120 is disposed under the first electrode 131, the lower surface of the first electrode 131 may have a flat planar shape. In this case, the lower surface of the planarization layer 120 may have a shape complementary to the phase modulation surface of the second reflective layer 110G or the third reflective layer 110R. The planarization layer 120 may include or be made of a conductive material or an insulating material.

Figure 12:
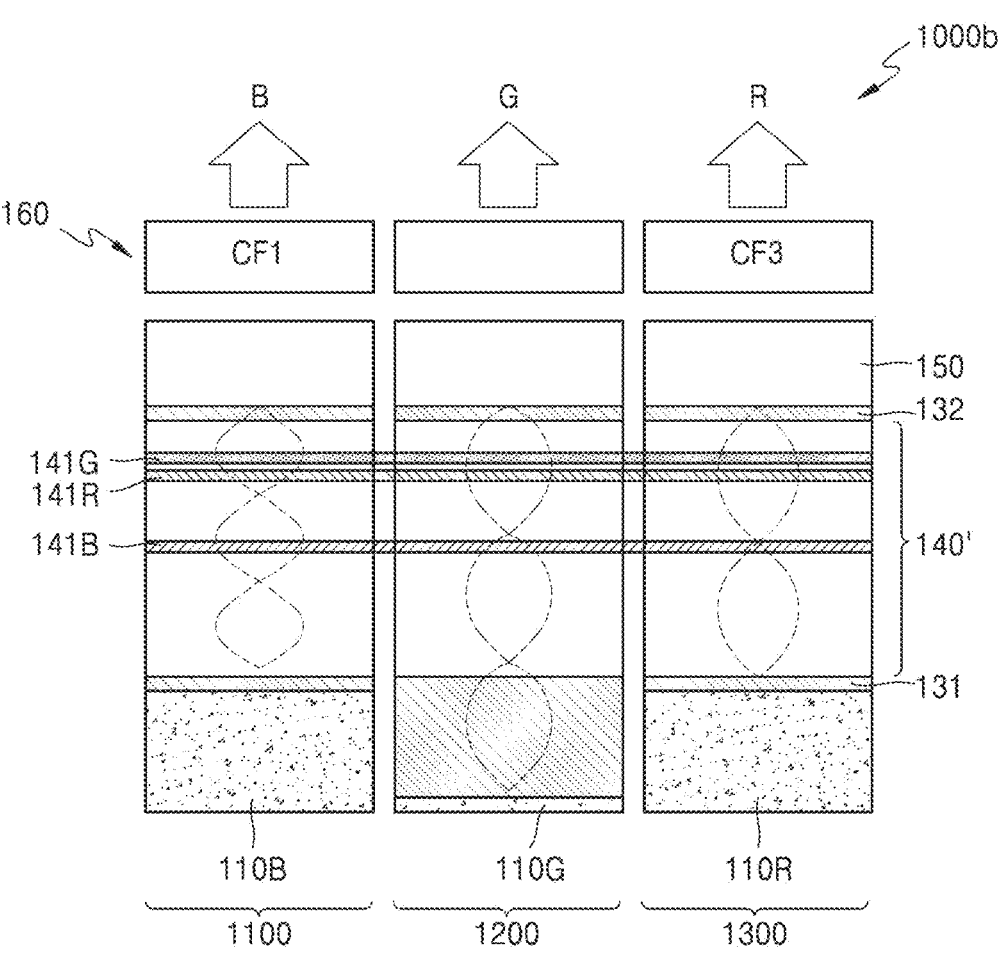
FIG. 12 is a cross-sectional view schematically showing the structure of a display apparatus according to another alternative embodiment.

FIG. 12 is a cross-sectional view schematically showing the structure of a display apparatus according to another alternative embodiment. Referring to FIG. 12, an embodiment of the light emitting layer 140' of the display apparatus 1000b may include a single first organic light emitting material layer 141B, a single second organic light emitting material layer 141G, and a single third organic light emitting material layer 141R. In such an embodiment, the first reflective layer 110B, the second reflective layer 110G, and the third reflective layer 110R all have a flat reflective surface. The distance between the upper surface of the first reflective layer 110B and the lower surface of the second electrode 132 may be selected or determined in a way such that third-order resonance occurs with respect to the light of the first wavelength band within the first micro-cavity. The distance between the upper surface of the second reflective layer 110G and the lower surface of the second electrode 132 may be selected such that third-order resonance occurs with respect to the light of the second wavelength band in the second micro-cavity. In such an embodiment, the distance between the upper surface of the third reflective layer 110R and the lower surface of the second electrode 132 may be selected or determined in a way such that second-order resonance occurs with respect to the light of the third wavelength band within the third micro-cavity. In such an embodiment, the distance between the upper surface of the second reflective layer 110G and the lower surface of the second electrode 132 may be greater than the distance between the upper surface of the first reflective layer 110B and the lower surface of the second electrode 132. The distance between the upper surface of the third reflective layer 110R and the lower surface of the second electrode 132 may be similar to or substantially the same as the distance between the upper surface of the first reflective layer 110B and the lower surface of the second electrode 132. In such an embodiment, the thickness of the second reflective layer 110G may be less than the thickness of the first reflective layer 110B and the thickness of the third reflective layer 110R. In such an embodiment, the height of the reflective surface of the second reflective layer 110G may be lower than the height of the reflective surface of the first reflective layer 110B and the third reflective layer 110R.

In an embodiment shown in FIG. 12, as the third-order resonance occurs for the light of the first wavelength band in the first micro-activity and the second-order resonance occurs at the same time for the light of the third wavelength band in the first micro-activity, the light of the third wavelength band may be emitted together with the light of the first wavelength band through the first pixel 1100. In such an embodiment, as the second-order resonance occurs for the light of the third wavelength band in the third micro-activity and the third-order resonance occurs at the same time for the light of the first wavelength band in the third micro-activity, the light of the first wavelength band may be emitted together with the light of the third wavelength band through the third pixel 1300. In such an embodiment, the first pixel 1100 may include a first color filter CF1 and the third pixel 1300 may include a third color filter CF3 to prevent or reduce such color mixing. In such an embodiment, the second pixel 1200, in which color mixing hardly occurs, may not include a color filter.

Figure 13:
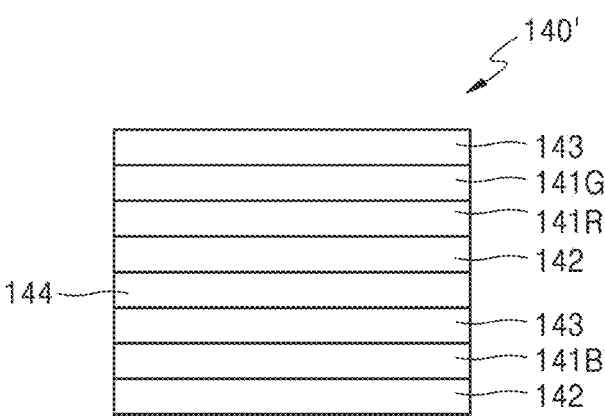
FIG. 13 is a cross-sectional view schematically illustrating an exemplary structure of the light emitting layer shown in FIG. 12.

FIG. 13 is a cross-sectional view schematically showing an exemplary structure of the light emitting layer 140' shown in FIG. 12. Referring to FIG. 13, in an embodiment, the second organic light emitting material layer 141G may be spaced apart from the first organic light emitting material layer 141B and may be disposed in direct contact with the third organic light emitting material layer 141R. The second organic light emitting material layer 141G and the third organic light emitting material layer 141R contacting each other may be disposed together between one electron injection layer 143 and one hole injection layer 142. In such an embodiment, the electron injection layer 143 and the hole injection layer 142 may be respectively disposed on the upper surface and the lower surface of the first organic light emitting material layer 141B. A charge generation layer 144 may be disposed between the hole injection layer 142 under the third organic light emitting material layer 141R and the electron injection layer 143 above the first organic light emitting material layer 141B. In such an embodiment, by adjusting the thickness of the charge generation layer 144, the first to third organic light emitting material layers 141B, 141G, and 141R may be positioned in the vicinity of the antinode of the corresponding wavelength standing wave, respectively.

Figure 14:
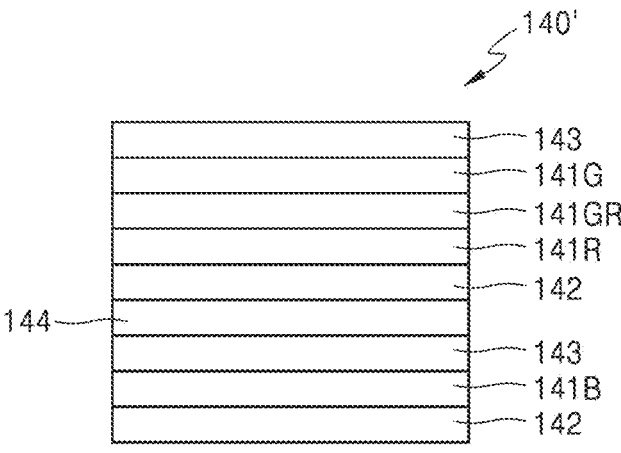
FIG. 14 is a cross-sectional view schematically showing another exemplary structure of the light emitting layer shown in FIG. 12.

FIG. 14 is a cross-sectional view schematically showing another exemplary structure of the light emitting layer 140' shown in FIG. 12. Referring to FIG. 14, in an embodiment, the second organic light emitting material layer 141G may be disposed to partially overlap the third organic light emitting material layer 141R. In an embodiment, for example, the mixture layer 141GR of the second organic light emitting material layer 141G and the third organic light emitting material layer 141R may be further disposed between the second organic light emitting material layer 141G and the third organic light emitting material layer 141R.

Figure 15:
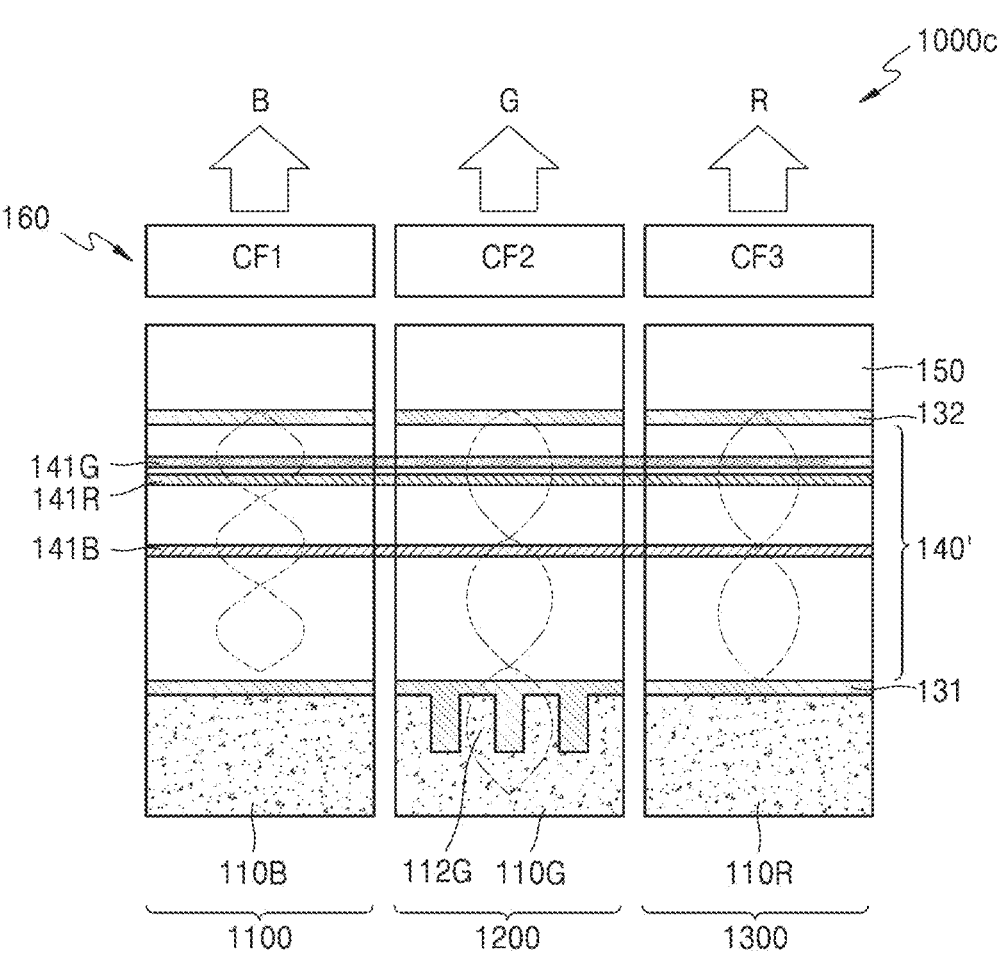
FIG. 15 is a cross-sectional view schematically showing the structure of a display apparatus according to another alternative embodiment.

FIG. 15 is a cross-sectional view schematically showing the structure of a display apparatus according to another alternative embodiment. Referring to FIG. 15, in an embodiment, the upper surface of the second reflective layer 110G of the display apparatus 1000c may include a phase modulation surface having a meta structure. In such an embodiment, the second pixel 1200 may further include a second color filter CF2. The remaining configuration of the display apparatus 1000c shown in FIG. 15 may be the same as the configuration of the display apparatus 1000b described above with reference to FIG. 12.

Figure 16:
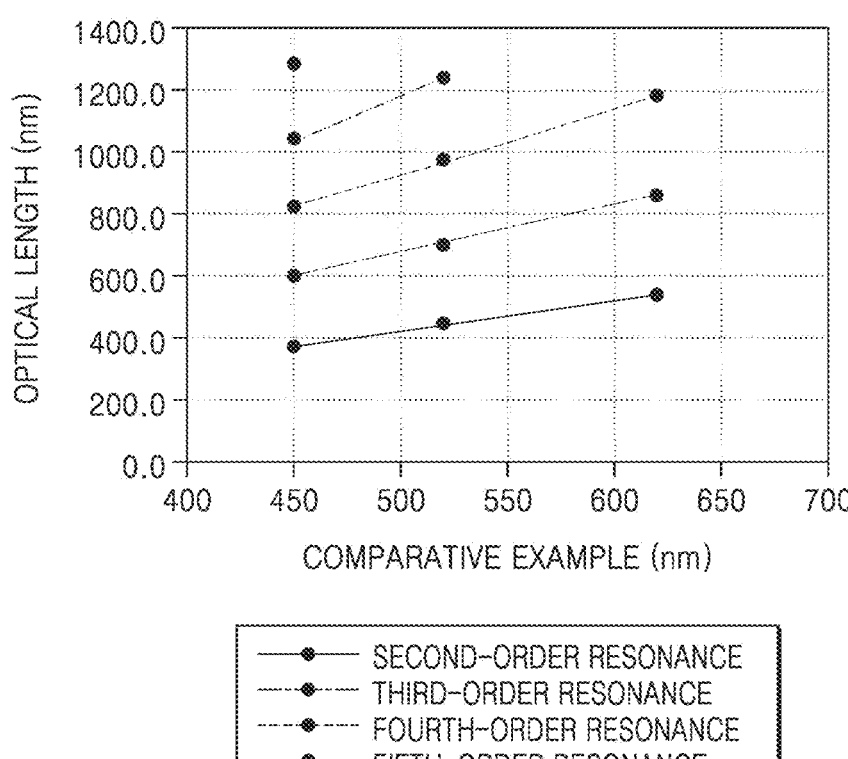
FIG. 16 is a graph exemplarily showing an optical length of a micro-cavity for each resonance order according to a wavelength.

FIG. 16 is a graph exemplarily showing the optical length of the micro-cavity for each resonance order according to the wavelength. Referring to FIG. 16, it may be seen that the optical length of the micro-cavity increases in proportion to the increase of the resonance order and the increase of the wavelength. In other words, the optical length of the micro-cavity increases to increase the wavelength of light resonating within the micro-cavity or increase the resonance order. In addition, when a first pixel 1100 that emits light of a first wavelength band, a second pixel 1200 that emits light of a second wavelength band, and a third pixel 1300 that emits light of a third wavelength band have micro-cavities of a same optical length as each other, the phase modulation become larger in the reflective layer of pixels that emit longer wavelength light.

In a case where the reflective surfaces of the second reflective layer 110G and the third reflective layer 110R both include a phase modulation surface having a meta structure, the phase delay by the third reflective layer 110R reflecting light of the third wavelength, which is red light having a relatively long wavelength, may be greater than the phase delay by the second reflective layer 110G that reflects light of the second wavelength, which is green light having a relatively short wavelength. In this case, the phase delay of the reflected light by the third reflective layer 110R become very larger to achieve the third or higher order resonance with respect to the light of the third wavelength. However, in a case having the form of the general nanostructure 112R shown in FIGS. 2 to 5, it may be difficult to achieve a large phase delay with respect to the light of the third wavelength.

Figure 17:
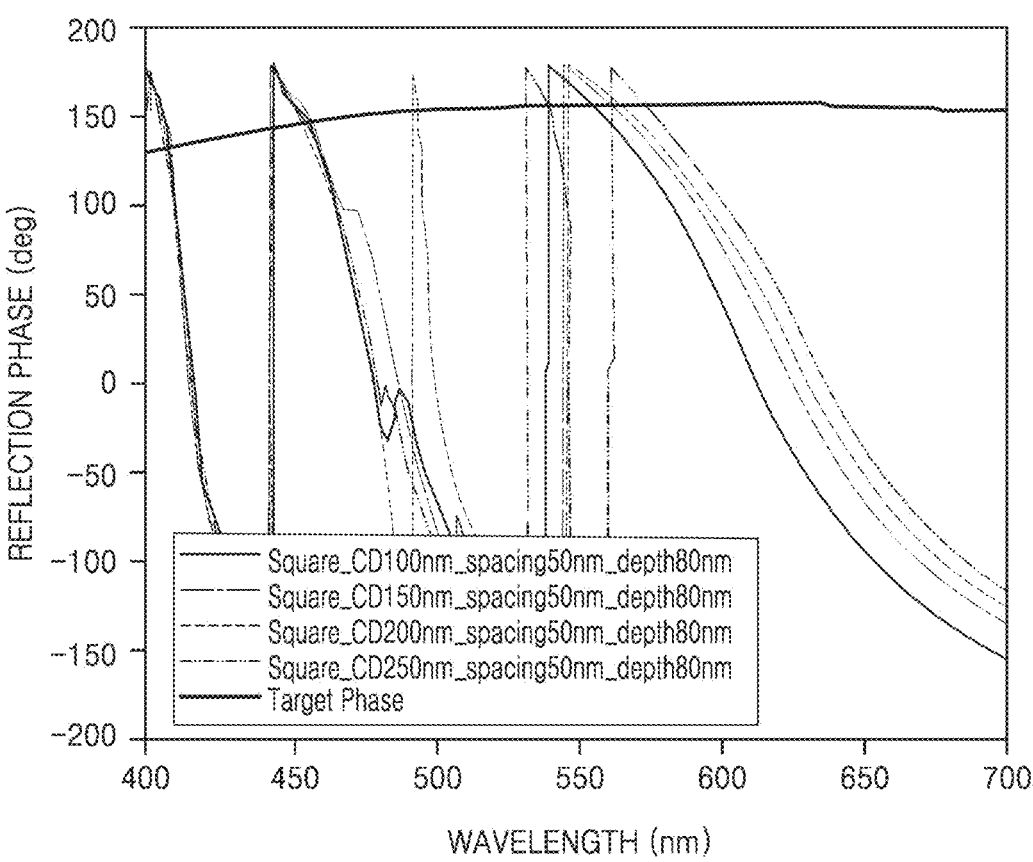
FIG. 17 is a graph exemplarily showing a reflection phase according to a dimension of a nanostructure having a square pillar shape.

FIG. 17 is a graph exemplarily showing a reflection phase according to a dimension of a nanostructure having a square pillar shape. In FIG. 17, "Target Phase" indicates a phase delay of reflected light required for fourth-order resonance according to a wavelength. Referring to FIG. 17, it may be seen that the phase delay of reflected light required for fourth-order resonance with respect to blue light and green light may be sufficiently achieved even with a nanostructure having a square pillar shape. However, even in a case where the dimensions of the plurality of nanostructures is increased to have the shape of a square column, for example, for red light having a wavelength of 600 nm or more, it may be difficult to achieve a phase delay of reflected light required for fourth-order resonance.

Figure 18A:
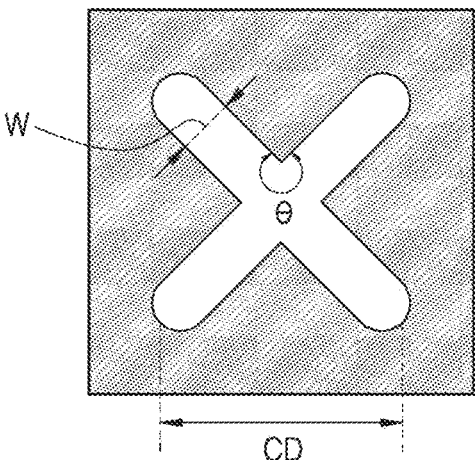
FIGS. 18A to 18C exemplarily show various types of nanostructures capable of providing a relatively large phase delay.
Figure 18B:
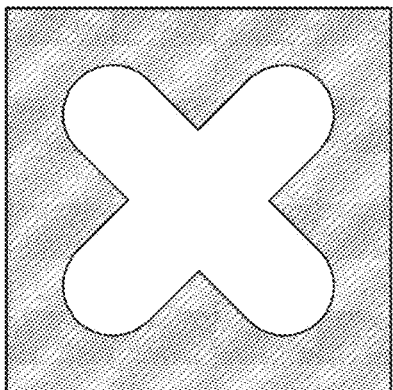
Figure 18C:
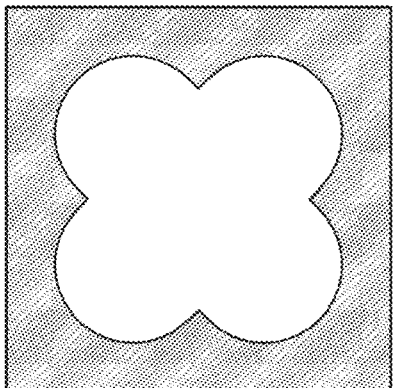

FIGS. 18A to 18C exemplarily show various types of nanostructures capable of providing a relatively large phase delay. Referring to FIGS. 18A to 18C, the nanostructure may have a 4-fold symmetry in which an interior angle θ between two adjacent sides is greater than about 180 degrees. In an embodiment, for example, the nanostructure may have an 'X' shape or a cross shape that is in 4-fold symmetry. In such an embodiment, the nanostructure may have a shape in which two rod portions overlap each other to be orthogonal to each other. The end of each rod portion may be angled or may have a curved shape.

Figure 19:
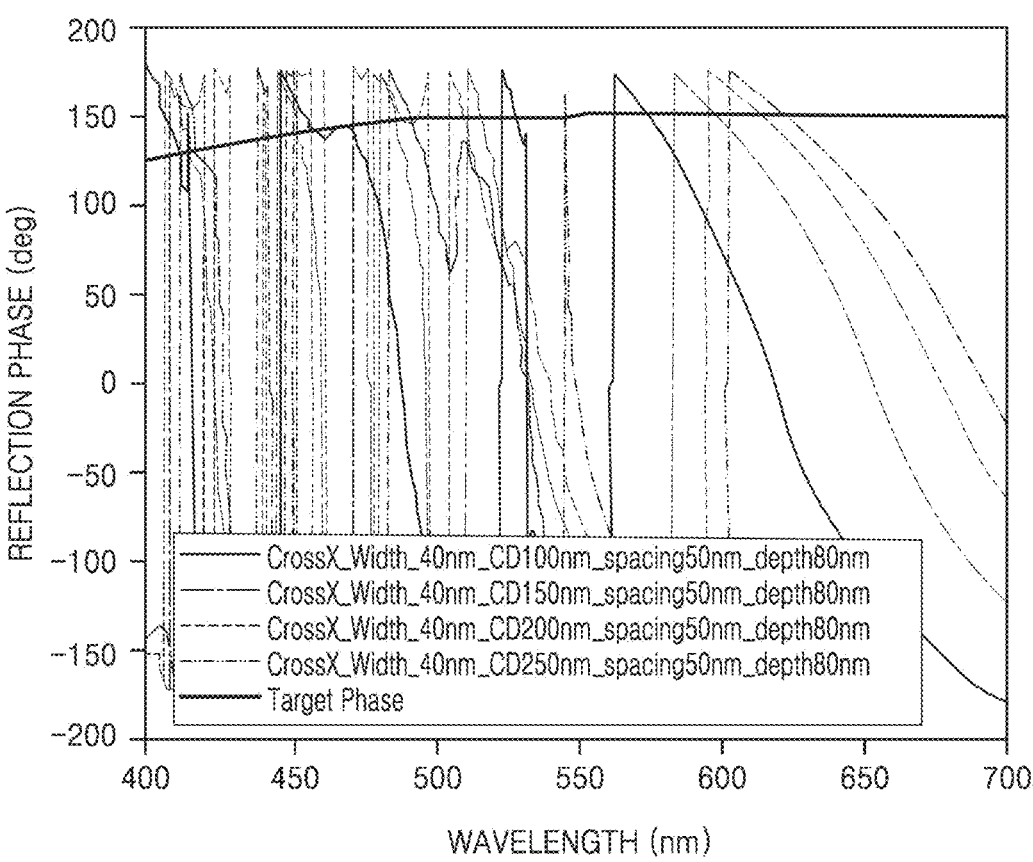
FIG. 19 is a graph exemplarily showing a reflection phase according to a dimension of a nanostructure having a cross shape.

FIG. 19 is a graph exemplarily showing a reflection phase according to a dimension of a nanostructure having a cross shape. In FIG. 19, the width 'CrossX_Width' may indicate the width of one rod portion in the nanostructure shown in FIG. 18A, and the critical dimension "CD" may indicate the entire width of the nanostructure. Referring to FIG. 19, when using a nanostructure in which the interior angle θ between two adjacent sides is greater than about 180 degrees, for red light, it may be seen that the phase delay of reflected light for fourth-order resonance may be sufficiently achieved. Accordingly, the nanostructure 112G of the second reflective layer 110G or the nanostructure 112R of the third reflective layer 110R may have any one of the shapes shown in FIGS. 18A to 18C.

Figure 20:
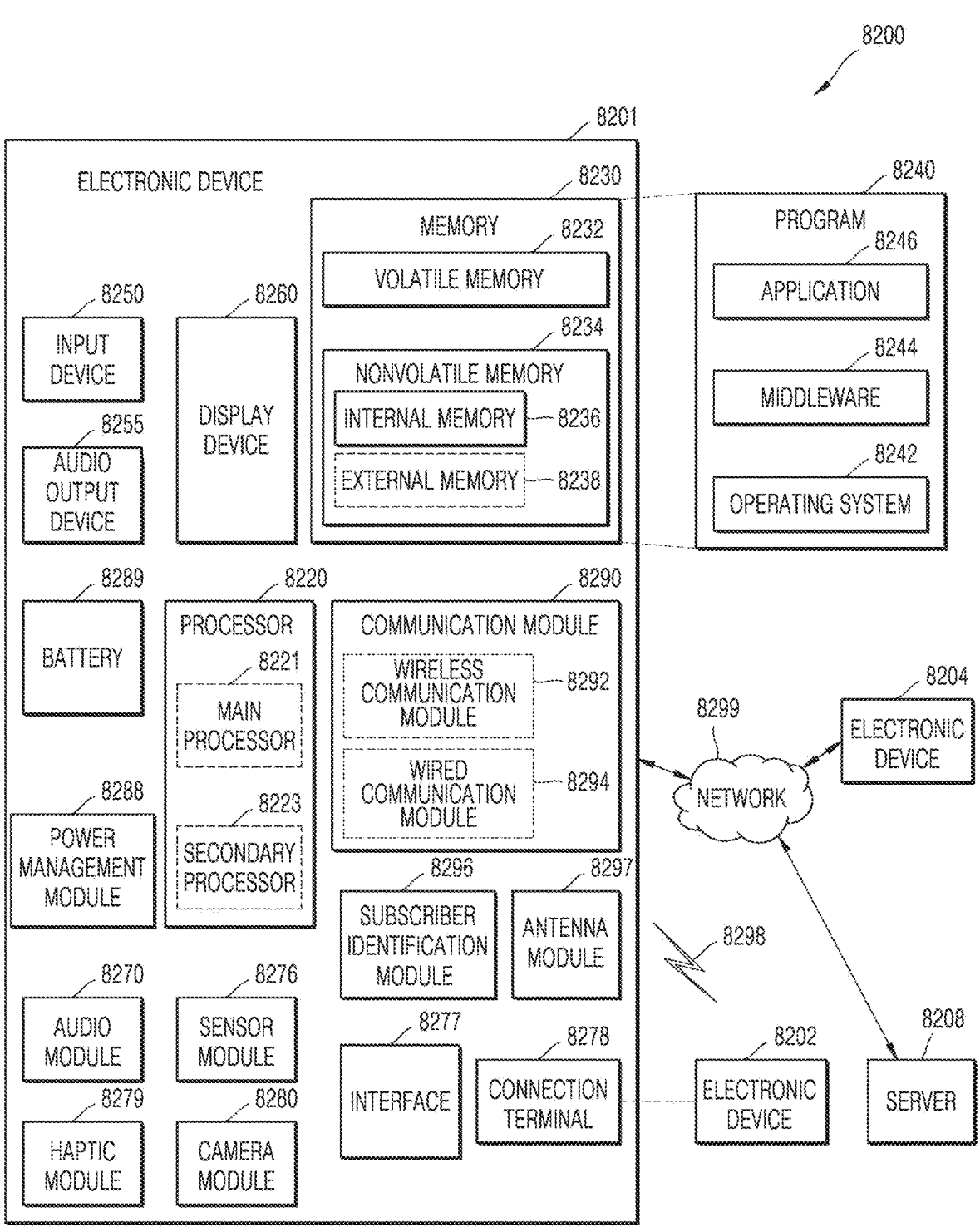
FIG. 20 is a schematic block diagram of an electronic apparatus according to an embodiment.

Embodiments of the display apparatus described herein may be applied to various types of electronic apparatus having a screen display function. FIG. 20 is a schematic block diagram of an electronic apparatus according to an example embodiment. Referring to FIG. 20, an embodiment of an electronic apparatus 8201 may be provided in a network environment 8200. In the network environment 8200, the electronic apparatus 8201 may communicate with another electronic apparatus 8202 through a first network 8298 (such as a short-range wireless communication network, and the like), or communicate with another electronic apparatus 8204 and/or a server 8208 through a second network 8299 (such as a remote wireless communication network). The electronic apparatus 8201 may communicate with another electronic apparatus 8204 through the server 8208. The electronic apparatus 8201 may include a processor 8220, a memory 8230, an input device 8250, an audio output device 8255, a display device 8260, an audio module 8270, a sensor module 8276, and an interface 8277, a haptic module 8279, a camera module 8280, a power management module 8288, a battery 8289, a communication module 8290, a subscriber identification module 8296, and/or an antenna module 8297. In an embodiment of the electronic apparatus 8201, some of these components may be omitted or other components may be added. Some of these components may be implemented as a single integrated circuit. In an embodiment, for example, the sensor module 8276 (fingerprint sensor, iris sensor, illuminance sensor, etc.) may be implemented by being embedded in the display device 8260 (display, etc.).

The processor 8220 may execute software (the program 8240, etc.) to control one or a plurality of other components (such as hardware, software components, etc.) of the electronic apparatus 8201 connected to the processor 8220, and perform various data processing or operations. As part of data processing or operation, the processor 8220 may load commands and/or data received from other components (the sensor module 8276, the communication module 8290, etc.) into a volatile memory 8232 of the memory 8230, process commands and/or data stored in the volatile memory 8232, and store result data in a nonvolatile memory 8234 of the memory 8230. The nonvolatile memory 8234 may include an internal memory 8236 mounted in the electronic apparatus 8201 and a removable external memory 8238. The processor 8220 may include a main processor 8221 (such as a central processing unit, an application processor, etc.) and a secondary processor 8223 (such as a graphics processing unit, an image signal processor, a sensor hub processor, a communication processor, etc.) that may be operated independently or together. The secondary processor 8223 may use less power than the main processor 8221 and may perform specialized functions.

The secondary processor 8223 may control functions and/or states related to some of the components of the electronic apparatus 8202 (such as the display device 8260, the sensor module 8276, the communication module 8290, etc.) instead of the main processor 8221 while the main processor 8221 is in an inactive state (sleep state), or with the main processor 8221 while the main processor 8221 is in an active state (application execution state). The secondary processor 8223 (such as an image signal processor, a communication processor, etc.) may be implemented as part of other functionally related components (such as the camera module 8280, the communication module 8290, etc.).

The memory 8230 may store various data used by components of the electronic apparatus 8201 (such as the processor 8220, the sensor module 8276, etc.). The data may include, for example, software (such as the program 8240, etc.) and input data and/or output data for commands related thereto. The memory 8230 may include the volatile memory 8232 and/or the nonvolatile memory 8234.

The program 8240 may be stored as software in the memory 8230 and may include an operating system 8242, a middleware 8244, and/or an application 8246.

The input device 8250 may receive commands and/or data to be used for components (such as the processor 8220, etc.) of the electronic apparatus 8201 from outside (a user) of the electronic apparatus 8201. The input device 8250 may include a remote controller, a microphone, a mouse, a keyboard, and/or a digital pen (such as a stylus pen).

The audio output device 8255 may output an audio signal to the outside of the electronic apparatus 8201. The audio output device 8255 may include a speaker and/or a receiver. The speaker may be used for general purposes such as multimedia playback or recording playback, and the receiver may be used to receive incoming calls. The receiver may be combined as a part of the speaker or may be implemented as an independent separate device.

The display device 8260 may visually provide information to the outside of the electronic apparatus 8201. The display device 8260 may include a display, a hologram device, or a projector and a control circuit for controlling the device. The display device 8260 may be an embodiment of the display apparatus 1000, 1000*a*, 1000*b*, or 1000*c* described above. The display device 8260 may include a touch circuitry set to sense a touch, and/or a sensor circuit (such as a pressure sensor) set to measure the strength of a force generated by the touch.

The audio module 8270 may convert sound into an electrical signal, or conversely, may convert an electrical signal into sound. The audio module 8270 may acquire sound through the input device 8250 or output sound through speakers and/or headphones of the audio output device 8255, and/or other electronic apparatuses (such as the electronic apparatus 8202) directly or wirelessly connected to the electronic apparatus 8201.

The sensor module 8276 may detect an operating state (such as power, temperature, and the like) of the electronic apparatus 8201 or an external environmental state (such as a user state, and the like), and generate an electrical signal and/or data value corresponding to the detected state. The sensor module 8276 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more specified protocols that may be used for the electronic apparatus 8201 to connect directly or wirelessly with another electronic apparatus (such as the electronic apparatus 8202). The interface 8277 may include a high definition multimedia interface (HDMI), a universal serial bus (USB) interface, a secure digital (SD) card interface, and/or an audio interface.

The connection terminal 8278 may include a connector through which the electronic apparatus 8201 may be physically connected to another electronic apparatus (such as the electronic apparatus 8202). The connection terminal 8278 may include an HDMI connector, a USB connector, an SD card connector, and/or an audio connector (such as a headphone connector).

The haptic module 8279 may convert an electrical signal into a mechanical stimulus (such as vibration, movement, etc.) or an electrical stimulus that a user may perceive through a tactile or motor sense. The haptic module 8279 may include a motor, a piezoelectric element, and/or an electrical stimulation device.

The camera module 8280 may capture a still image and a video. The camera module 8280 may include a lens assembly including one or more lenses, image sensors, image signal processors, and/or flashes. The lens assembly included in the camera module 8280 may collect light emitted from a subject that is a target of image capturing.

The power management module 8288 may manage power supplied to the electronic apparatus 8201. The power management module 8288 may be implemented as a part of a power management integrated circuit (PMIC).

The battery 8289 may supply power to components of the electronic apparatus 8201. The battery 8289 may include a non-rechargeable primary cell, a rechargeable secondary cell, and/or a fuel cell.

The communication module 8290 may support establishing a direct (wired) communication channel and/or a wireless communication channel, and performing communication through the established communication channel between the electronic apparatus 8201 and other electronic apparatuses (such as the electronic apparatus 8202, the electronic apparatus 8204, the server 8208, and the like). The communication module 8290 may include one or more communication processors that operate independently of the processor 8220 (such as an application processor) and support direct communication and/or wireless communication. The communication module 8290 may include a wireless communication module 8292 (such as a cellular communication module, a short-range wireless communication module, a global navigation satellite system (GNSS) communication module, and the like) and/or a wired communication module 8294 (such as a local area network (LAN) communication module, a power line communication module, and the like). Among these communication modules, a corresponding communication module may communicate with other electronic apparatuses through a first network 8298 (a short-range communication network such as Bluetooth, WiFi Direct, or infrared data association (IrDA)) or a second network 8299 (a cellular network, the Internet, or a telecommunication network such as a computer network (such as LAN, WAN, and the like)). These various types of communication modules may be integrated into one component (such as a single chip, and the like), or may be implemented as a plurality of separate components (a plurality of chips). The wireless communication module 8292 may check and authenticate the electronic apparatus 8201 in a communication network such as the first network 8298 and/or the second network 8299 using the subscriber information (such as international mobile subscriber identifier (IMSI), etc.) stored in the subscriber identification module 8296.

The antenna module 8297 may transmit signals and/or power to the outside (such as other electronic apparatuses) or receive signals and/or power from the outside. The antenna module 8297 may include one or a plurality of antennas. The antenna may include a radiator including or made of a conductive pattern formed on a substrate (such as PCB, etc.). In an embodiment where multiple antennas are included, an antenna suitable for a communication method used in a communication network such as the first network 8298 and/or the second network 8299 may be selected from the plurality of antennas by the communication module 8290. Signals and/or power may be transmitted or received between the communication module 8290 and another electronic apparatus through the selected antenna. In addition to the antenna, other components (such as RFIC) may be included as part of the antenna module 8297.

Some of the components are connected to each other and may exchange signals (such as commands, data, and the like) through communication method between peripheral devices (such as bus, general purpose input and output (GPIO), serial peripheral interface (SPI), mobile industry processor interface (MIPI), and the like).

The command or data may be transmitted or received between the electronic apparatus 8201 and the external electronic apparatus 8204 through the server 8208 connected to the second network 8299. Other electronic apparatuses 8202 and 8204 may be a same type of electronic apparatus as the electronic apparatus 8201 or different types of electronic apparatus from the electronic apparatus 8201. All or some of the operations executed by the electronic apparatus 8201 may be executed by one or more of the other electronic apparatuses 8202, 8204, and 8208. In an embodiment, for example, when the electronic apparatus 8201 needs to perform a certain function or service, instead of executing the function or service itself, the electronic apparatus 8201 may request one or more other electronic apparatuses to perform the function or part or all of the service. One or more other electronic apparatuses that receive the request may execute an additional function or service related to the request, and transmit a result of the execution to the electronic apparatus 8201, by using cloud computing, distributed computing, and/or client-server computing technology.

Figure 21:
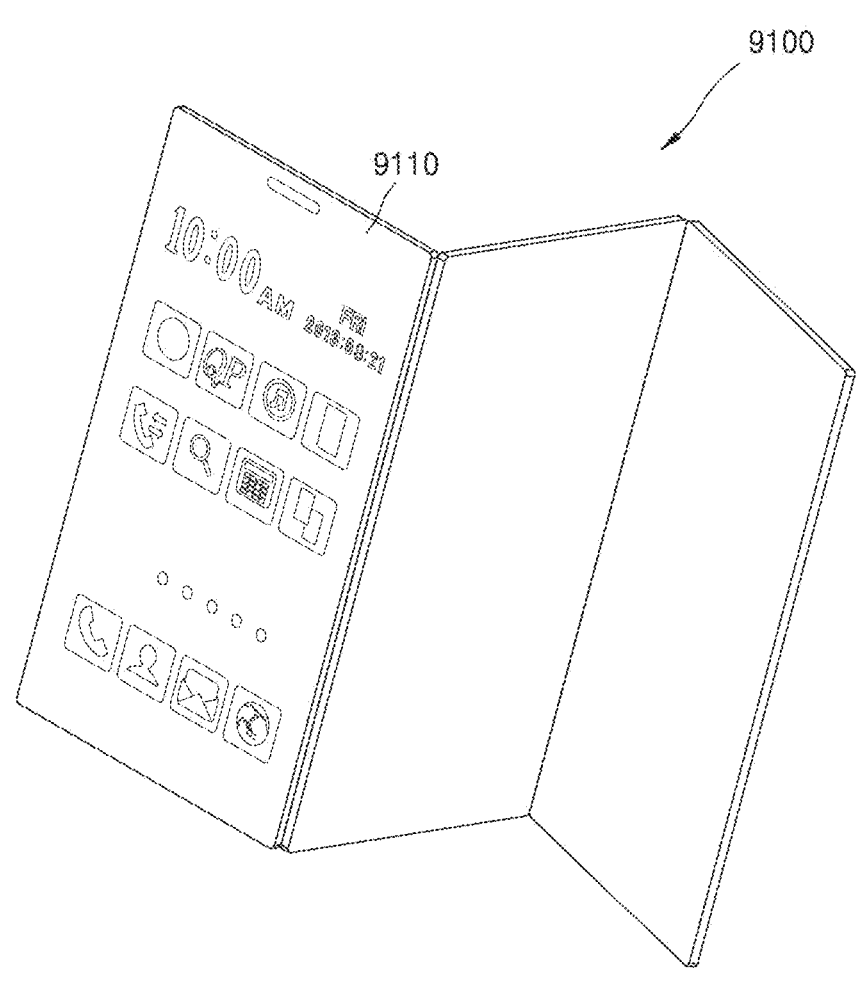
FIG. 21 illustrates an embodiment in which the display apparatus is applied to a mobile device.

FIG. 21 illustrates an embodiment in which a display apparatus is applied to a mobile device. The mobile device 9100 may include a display apparatus 9110, and the display apparatus 9110 may be an embodiment of the display apparatuses 1000, 1000*a*, 1000*b*, and 1000*c* described above. The display apparatus 9110 may have a foldable structure, for example, a multi-foldable structure.

Figure 22:
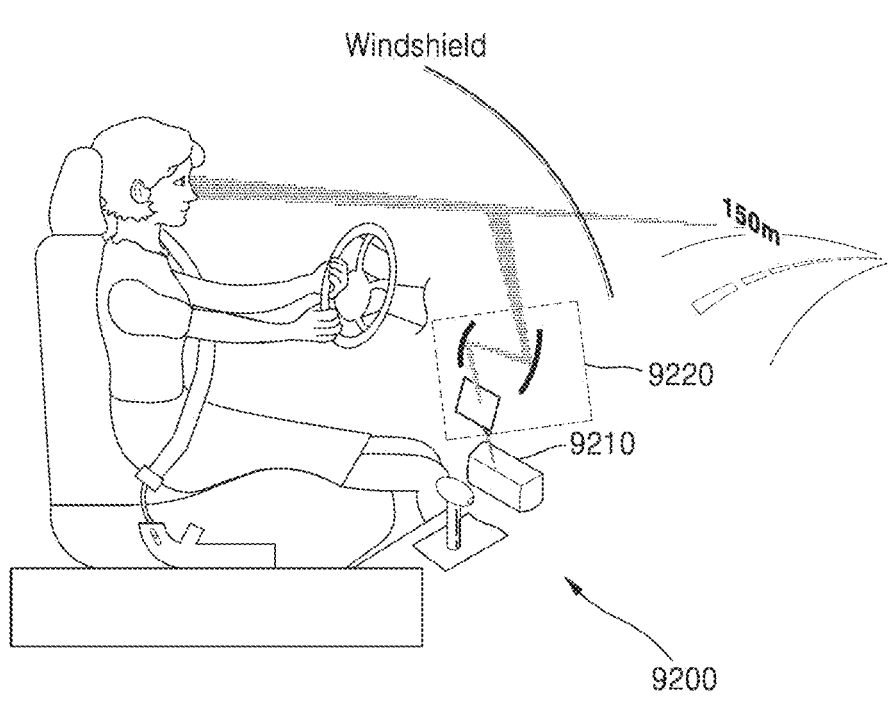
FIG. 22 shows an embodiment in which the display apparatus is applied to the display apparatus for a vehicle.

FIG. 22 illustrates an embodiment in which the display apparatus is applied to a vehicle display apparatus. The display apparatus may be a vehicle head-up display apparatus 9200, and may include a display 9210 provided in an area of the vehicle, and a light path changing member 9220 that converts an optical path so that the driver may see the image generated on the display 9210. The display 9210 may be an embodiment of the display apparatuses 1000, 1000*a*, 1000*b*, and 1000*c* described above.

Figure 23:
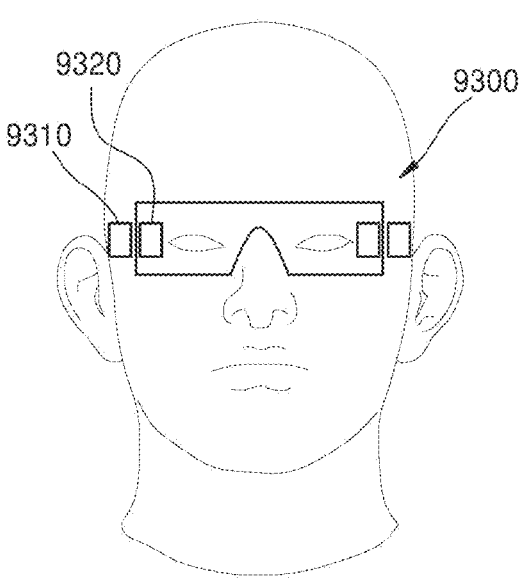
FIG. 23 illustrates an embodiment in which the display apparatus is applied to augmented reality glasses or virtual reality glasses.

FIG. 23 illustrates an embodiment in which a display apparatus is applied to augmented reality glasses or virtual reality glasses. Augmented reality device 9300 having the form of glasses may include a projection system 9310 including a display apparatus for forming an image, and optics 9320 for guiding the image from the projection system 9310 into the user's eye. The projection system 9310 may include an embodiment of the display apparatuses 1000, 1000*a*, 1000*b*, and 1000*c* described above.

Figure 24:
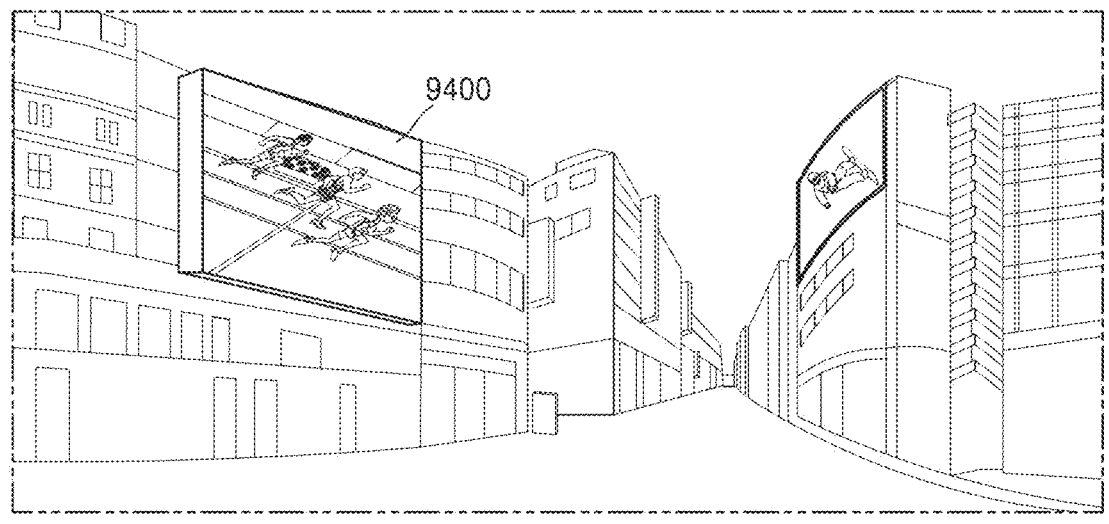
FIG. 24 shows an embodiment in which the display apparatus is applied to a signage.
Figure 25:
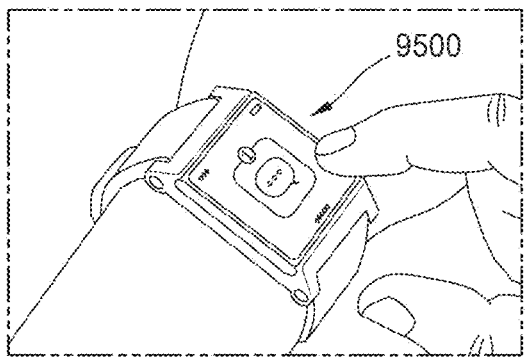
FIG. 25 illustrates an embodiment in which the display apparatus is applied to a wearable display.

FIG. 24 shows an embodiment in which the display apparatus is applied to a signage. A signage 9400 may be used for outdoor advertisement using a digital information display, and may control advertisement contents and the like through a communication network. The signage 9400 may be implemented, for example, through the electronic apparatus described with reference to FIG. 20. The signage 9400 may include an embodiment of the display apparatuses 1000, 1000*a*, 1000*b*, and 1000*c* described above FIG. 25 illustrates an embodiment in which a display apparatus is applied to a wearable display. The wearable display 9500 may be an embodiment of the display apparatus 1000, 1000*a*, 1000*b*, and 1000*c* described above, and may be implemented through the electronic apparatus described with reference to FIG. 20.

In embodiments, the display apparatus may also be applied to various products such as a rollable TV and a stretchable display.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
a first pixel which emits light of a first wavelength band;
a second pixel which emits light of a second wavelength band different from the first wavelength band; and
a third pixel which emits light of a third wavelength band different from the first wavelength band and the second wavelength band,
wherein each of the first pixel, the second pixel and the third pixel comprises:
a reflective layer; and
a first electrode disposed on the reflective layer thereof,
wherein the first electrode of the first pixel, the first electrode of the second pixel and the first electrode of the third pixel have different structures from each other to match a surface structure of the reflective layer corresponding thereto,
wherein the first pixel further comprises:
a light emitting layer disposed on the first electrode of the first pixel;
a second electrode disposed on the light emitting layer of the first pixel; and
a first color filter disposed on the second electrode of the first pixel,
wherein the first color filter transmits the light of the first wavelength band,
wherein the reflective layer and the second electrode define a first micro-cavity in which the light of the first wavelength band resonates,
wherein the light emitting layer of the first pixel comprises a first portion and a second portion, each of the first portion and the second portion comprising a first organic light emitting material layer which emits the light of the first wavelength band, a second organic light emitting material layer which emits the light of the second wavelength band, and a third organic light emitting material layer which emits the light of the third wavelength band, and
wherein an order of stacking of the first to third organic light emitting material layer in the first portion is different from an order of stacking of the first to third organic light emitting material layer in the second portion such that in the first portion, the third organic light emitting material layer is adjacent to the first organic light emitting material layer and is spaced apart from the second organic light emitting material layer, and in the second portion, the third organic light emitting material layer is adjacent to the second organic light emitting material layer and is spaced apart from the first organic light emitting material layer.

2. The display apparatus of claim 1, wherein the first organic light emitting material layer of the first portion and the first organic light emitting material layer of the second portion are disposed on anodes of the first wavelength band resonating within the first micro-cavity.

3. The display apparatus of claim 1, wherein the first micro-cavity is defined to generate a third or higher order resonance with respect to the first wavelength band.

4. The display apparatus of claim 1, wherein the reflective layer of the first pixel has a flat reflective surface.

5. The display apparatus of claim 1, wherein the first organic light emitting material layer of the first pixel comprises a first light emitting dopant, the second organic light emitting material layer of the first pixel comprises a second light emitting dopant, and the third organic light emitting material layer of the first pixel comprises a third light emitting dopant, wherein the second organic light emitting material layer of the first pixel and the third organic light emitting material layer of the first pixel are disposed adjacent to or mixed with each other to enable energy transfer from the second light emitting dopant to the third light emitting dopant.

6. The display apparatus of claim 5, wherein the second organic light emitting material layer of the first pixel is spaced apart from the first organic light emitting material layer of the first pixel and disposed in direct contact with the third organic light emitting material layer of the first pixel.

7. The display apparatus of claim 5, wherein each of the second light emitting dopant and the third light emitting dopant comprises a phosphorescent dopant material, and the first light emitting dopant comprises a fluorescent dopant material.

8. The display apparatus of claim 5, wherein the light emitting layer of the first pixel further comprises a mixture layer of the second organic light emitting material layer of the first pixel and the third organic light emitting material layer of the first pixel, the mixture layer of the first pixel is disposed between the second organic light emitting material layer of the first pixel and the third organic light emitting material layer of the first pixel.

9. The display apparatus of claim 5, wherein a concentration of a second light emitting dopant in the second organic light emitting material layer of the first pixel is higher than a concentration of a third light emitting dopant in the third organic light emitting material layer of the first pixel.

10. The display apparatus of claim 1, wherein the first organic light emitting material layer of the first pixel comprises a first light emitting dopant, the second organic light emitting material layer of the first pixel comprises a second light emitting dopant, and the third organic light emitting material layer comprises a third light emitting dopant, wherein the first organic light emitting material layer of the first pixel and the third organic light emitting material layer of the first pixel are disposed adjacent to or mixed with each other to enable energy transfer from the first light emitting dopant to the third light emitting dopant.

11. The display apparatus of claim 10, wherein the first organic light emitting material layer of the first pixel is spaced apart from the second organic light emitting material layer of the first pixel and disposed in direct contact with the third organic light emitting material layer of the first pixel.

12. The display apparatus of claim 10, wherein each of the first light emitting dopant and the third light emitting dopant comprises a phosphorescent dopant material, and the second light emitting dopant comprises a fluorescent dopant material.

13. The display apparatus of claim 10, wherein the light emitting layer of the first pixel further comprises a mixture layer of the first organic light emitting material layer of the first pixel and the third organic light emitting material layer of the first pixel, and the mixture layer is disposed between the first organic light emitting material layer of the first pixel and the third organic light emitting material layer of the first pixel.

14. The display apparatus of claim 10, wherein a concentration of a first light emitting dopant in the first organic light emitting material layer of the first pixel is higher than a concentration of a third light emitting dopant in the third organic light emitting material layer of the first pixel.

15. The display apparatus of claim 1, wherein the second pixel further comprises:

a light emitting layer disposed on the first electrode of the second pixel; and a second electrode disposed on the light emitting layer of the second pixel, wherein the reflective layer of the second pixel and the second electrode of the second pixel define a second micro-cavity in which light of the second wavelength band resonates, wherein the light emitting layer of the second pixel comprises a first organic light emitting material layer which emits light of the first wavelength band, a second organic light emitting material layer which emits light of the second wavelength band, and a third organic light emitting material layer which emits light of the third wavelength band.

16. The display apparatus of claim 15, wherein the second organic light emitting material layer of the second pixel is disposed on an antinode of the second wavelength band resonating within the second micro-cavity.

17. The display apparatus of claim 15, wherein the second micro-cavity of the second pixel is defined to generate a third or higher order resonance with respect to the second wavelength band.

18. The display apparatus of claim 15, wherein the reflective layer of the second pixel comprises a plurality of nanostructures periodically arranged therein.

19. The display apparatus of claim 18, wherein an arrangement period of the plurality of nanostructures is in a range of about 50 nm to about 400 nm.

20. The display apparatus of claim 18, wherein each of the plurality of nanostructures is defined by a pillar or a hole having a circular or polygonal shape and in 4-fold symmetry.

21. The display apparatus of claim 20, wherein each of the plurality of nanostructures has a plurality of sides, and an interior angle between two adjacent sides among plurality of sides is greater than about 180 degrees.

22. The display apparatus of claim 20, wherein a height or depth of each of the plurality of nanostructures is in a range of about 0 nm to about 150 nm.

23. The display apparatus of claim 15, wherein the second pixel further comprises a second color filter disposed on the second electrode of the second pixel, and the second color filter transmits the light of the second wavelength band.

24. The display apparatus of claim 15, wherein the reflective layer of the second pixel has a flat reflective surface, wherein the reflective layer of the first pixel and the reflective layer of the second pixel have different thicknesses from each other.

25. The display apparatus of claim 15, wherein the third pixel further comprises:

a light emitting layer disposed on the first electrode of the third pixel;

a second electrode disposed on the light emitting layer of the third pixel; and a third color filter disposed on the second electrode of the third pixel, wherein the third color filter transmits the light of the third wavelength band, wherein the reflective layer of the third pixel and the second electrode of the third pixel define a third micro-cavity in which light of the third wavelength band resonates, wherein the light emitting layer of the third pixel comprises a first organic light emitting material layer which emits light of the first wavelength band, a second organic light emitting material layer which emits light of the second wavelength band, and a third organic light emitting material layer which emits light of the third wavelength band.

26. The display apparatus of claim 25, wherein the third organic light emitting material layer of the third pixel is disposed on an antinode of the third wavelength band resonating within the third micro-cavity.

27. The display apparatus of claim 25, wherein the light emitting layer of the first pixel, the light emitting layer of the second pixel, and the light emitting layer of the third pixel have a same structure as each other.

28. The display apparatus of claim 25, wherein the reflective layer of the third pixel comprises a plurality of nanostructures periodically arranged therein.

29. The display apparatus of claim 25, wherein the reflective layer of the third pixel has a flat reflective surface.

30. An electronic apparatus comprising a processor, a memory, an input device, a sound output device, and a display apparatus, wherein the display apparatus comprises: a first pixel which emits light of a first wavelength band; a second pixel which emits light of a second wavelength band different from the first wavelength band; and a third pixel which emits light of a third wavelength band different from the first wavelength band and the second wavelength band, wherein each of the first pixel, the second pixel and the third pixel comprises:

a reflective layer; and a first electrode disposed on the reflective layer thereof, wherein the first electrode of the first pixel, the first electrode of the second pixel and the first electrode of the third pixel have different structures from each other to match a surface structure of the reflective layer corresponding thereto, wherein the first pixel further comprises:

a light emitting layer disposed on the first electrode;

a second electrode disposed on the light emitting layer; and a first color filter disposed on the second electrode, where the first color filter transmits the light of the first wavelength band, wherein the reflective layer and the second electrode define a micro-cavity in which the light of the first wavelength band resonates, wherein the light emitting layer comprises a first portion and a second portion, each of the first portion and the second portion comprising a first organic light emitting material layer which emits the light of the first wavelength band, a second organic light emitting material layer which emits the light of the second wavelength band, and a third organic light emitting material layer which emits the light of the third wavelength band, and wherein an order of stacking of the first to third organic light emitting material layer in the first portion is different from an order of stacking of the first to third organic light emitting material layer in the second portion such that in the first portion, the third organic light emitting material layer is adjacent to the first organic light emitting material layer and is spaced apart from the second organic light emitting material layer, and in the second portion, the third organic light emitting material layer is adjacent to the second organic light emitting material layer and is spaced apart from the first organic light emitting material layer.

* * * * *